United States Patent
Yu et al.

(10) Patent No.: US 9,449,837 B2
(45) Date of Patent: Sep. 20, 2016

(54) 3D CHIP-ON-WAFER-ON-SUBSTRATE STRUCTURE WITH VIA LAST PROCESS

(71) Applicant: Taiwan Semiconductor Manufacturing Company, Ltd., Hsin-Chu (TW)

(72) Inventors: Chen-Hua Yu, Hsin-Chu (TW); Ming-Fa Chen, Taichung (TW); Wen-Ching Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/657,354

(22) Filed: Mar. 13, 2015

(65) Prior Publication Data

US 2015/0325497 A1    Nov. 12, 2015

Related U.S. Application Data

(63) Continuation-in-part of application No. 14/444,681, filed on Jul. 28, 2014.

(60) Provisional application No. 61/991,287, filed on May 9, 2014.

(51) Int. Cl.
*H01L 21/00* (2006.01)
*H01L 21/311* (2006.01)
(Continued)

(52) U.S. Cl.
CPC ........ *H01L 21/311* (2013.01); *H01L 21/31111* (2013.01); *H01L 21/31144* (2013.01); *H01L 21/48* (2013.01); *H01L 21/486* (2013.01); *H01L 21/568* (2013.01); *H01L 21/768* (2013.01); *H01L 21/76802* (2013.01); *H01L 21/76877* (2013.01); *H01L 21/76898* (2013.01); *H01L 23/3114* (2013.01); *H01L 23/481* (2013.01); *H01L 23/49827* (2013.01); *H01L 23/522* (2013.01); *H01L 24/09* (2013.01); *H01L 24/19* (2013.01); *H01L 24/20* (2013.01); *H01L 24/80* (2013.01); *H01L 24/89* (2013.01); *H01L 24/92* (2013.01); *H01L 24/94* (2013.01); *H01L 25/0657* (2013.01); *H01L 25/50* (2013.01);
(Continued)

(58) Field of Classification Search
USPC .............. 438/106, 109, 125, 107, 108, 667; 257/774, 686, E21.002, E21.499, 257/E23.011, E23.023, E23.172, 531, 532, 257/721, 723, 738
See application file for complete search history.

(56) References Cited

U.S. PATENT DOCUMENTS 8,350,377 B2    1/2013 Yang
9,059,109 B2 *  6/2015 Lin ........................ H01L 21/565
(Continued)

FOREIGN PATENT DOCUMENTS

TW    201208004 A    2/2012

*Primary Examiner* — Telly Green
(74) *Attorney, Agent, or Firm* — Slater Matsil, LLP

(57) ABSTRACT

Disclosed herein is a package having a first redistribution layer (RDL) disposed on a first semiconductor substrate and a second RDL disposed on a second semiconductor substrate. The first RDL is bonded to the second RDL. The package further includes an insulating film disposed over the second RDL and around the first RDL and the first semiconductor substrate. A conductive element is disposed in the first RDL. A via extends from a top surface of the insulating film, through the first semiconductor substrate to the conductive element, and a spacer is disposed between the first semiconductor substrate and the via. The spacer extends through the first semiconductor substrate.

20 Claims, 28 Drawing Sheets

(51) Int. Cl.

| | |
|---|---|
| *H01L 23/498* | (2006.01) |
| *H01L 23/00* | (2006.01) |
| *H01L 21/768* | (2006.01) |
| *H01L 21/48* | (2006.01) |
| *H01L 23/31* | (2006.01) |
| *H01L 21/56* | (2006.01) |
| *H01L 23/48* | (2006.01) |
| *H01L 23/522* | (2006.01) |
| *H01L 25/065* | (2006.01) |
| *H01L 25/00* | (2006.01) |

(52) U.S. Cl.
CPC ......... *H01L2224/0231* (2013.01); *H01L 2224/0237* (2013.01); *H01L 2224/02122* (2013.01); *H01L 2224/02371* (2013.01); *H01L 2224/02372* (2013.01); *H01L 2224/04105* (2013.01); *H01L 2224/08145* (2013.01); *H01L 2224/11002* (2013.01); *H01L 2224/12105* (2013.01); *H01L 2224/80001* (2013.01); *H01L 2224/80006* (2013.01); *H01L 2224/9202* (2013.01); *H01L 2224/94* (2013.01)

(56) References Cited

U.S. PATENT DOCUMENTS

| | | |
|---|---|---|
| 2003/0017647 A1 | 1/2003 | Kwon et al. |
| 2005/0104219 A1 | 5/2005 | Matsui |
| 2008/0116584 A1 | 5/2008 | Sitaram |
| 2011/0133339 A1 | 6/2011 | Wang |
| 2011/0204505 A1 | 8/2011 | Pagaila et al. |
| 2014/0264933 A1* | 9/2014 | Yu .................. H01L 21/768 257/774 |
| 2015/0318263 A1* | 11/2015 | Yu .................. H01L 25/0657 257/774 |

* cited by examiner

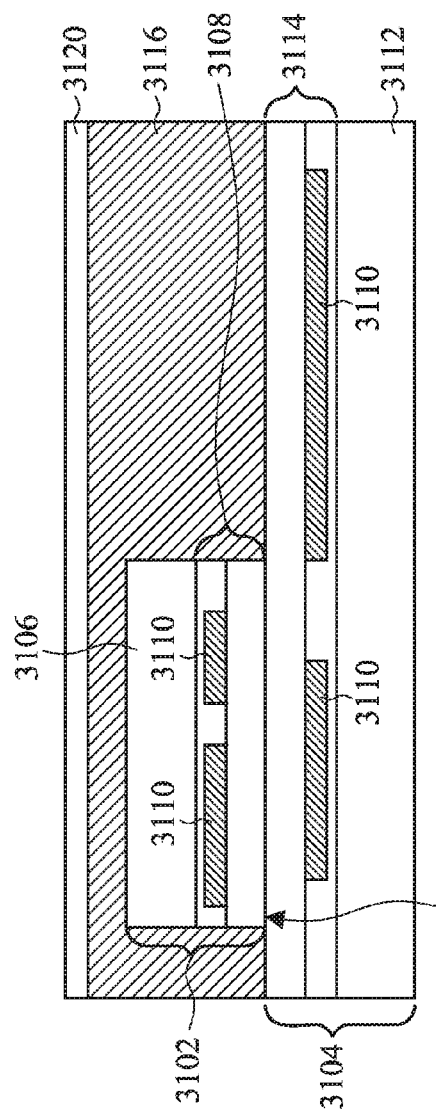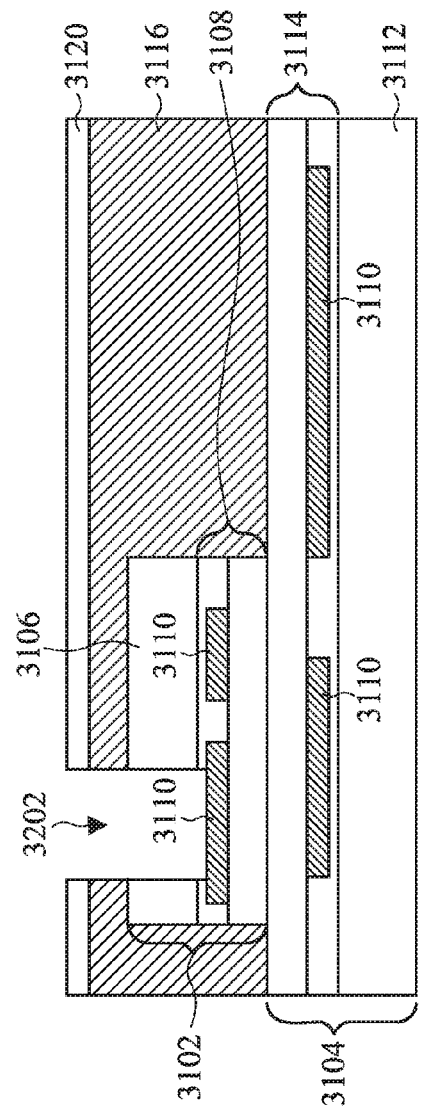

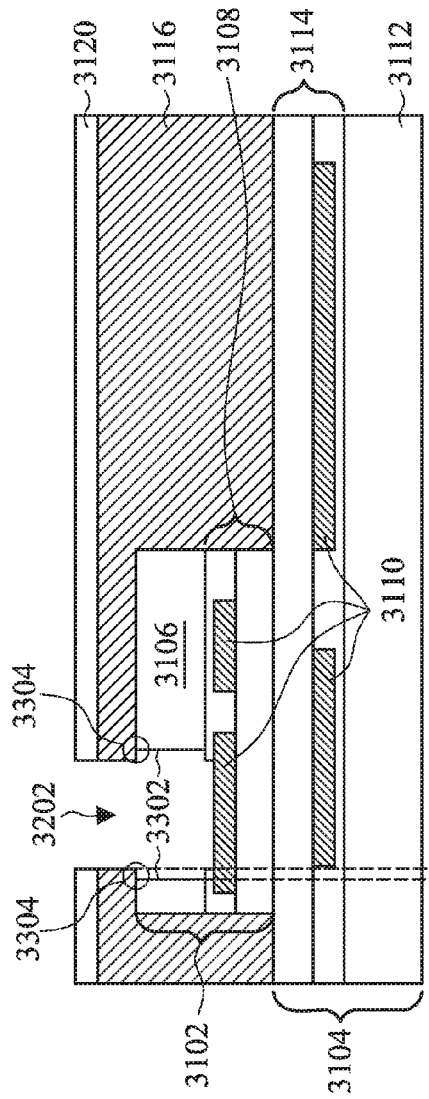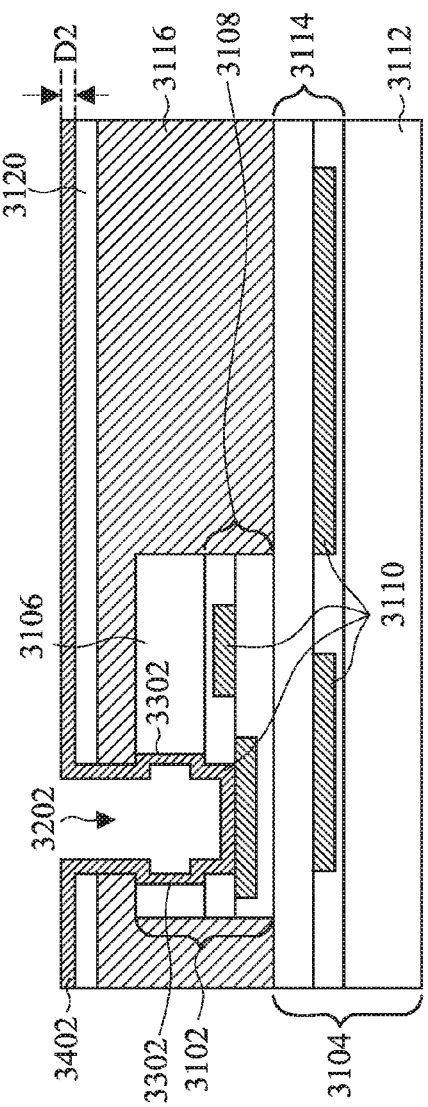

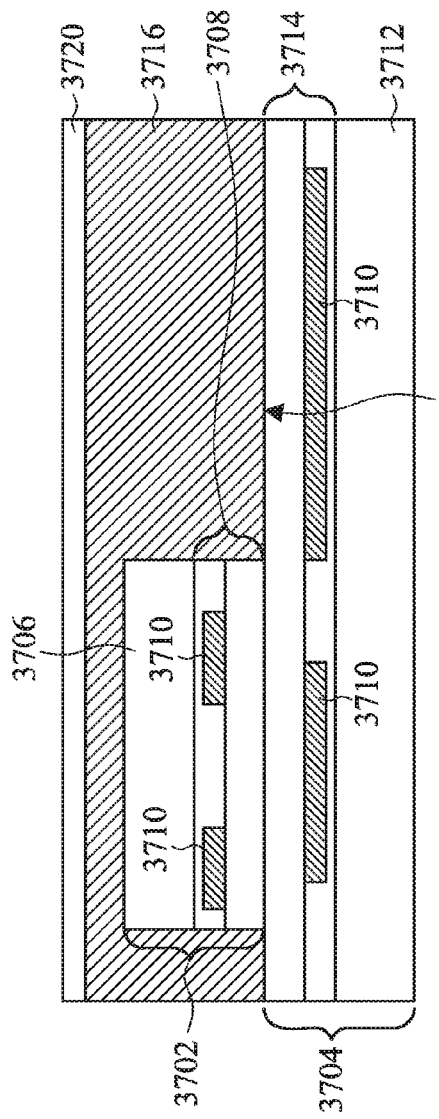
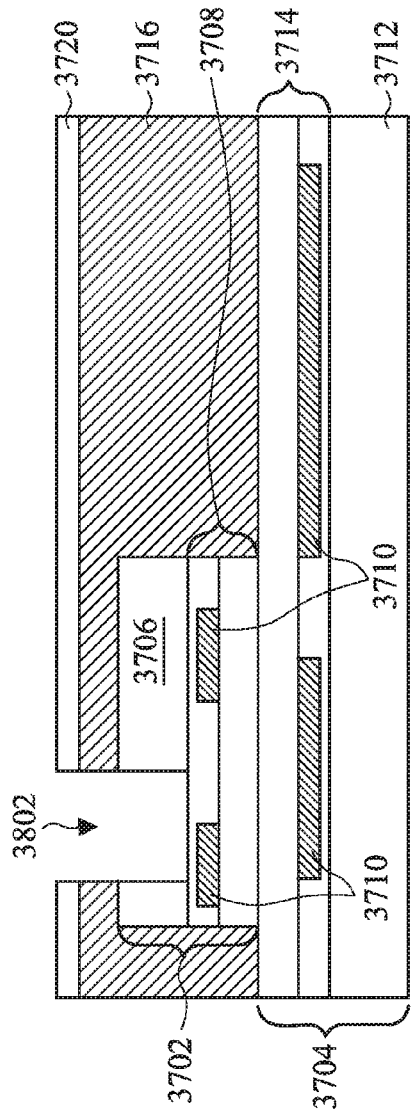
Fig. 37
Fig. 38

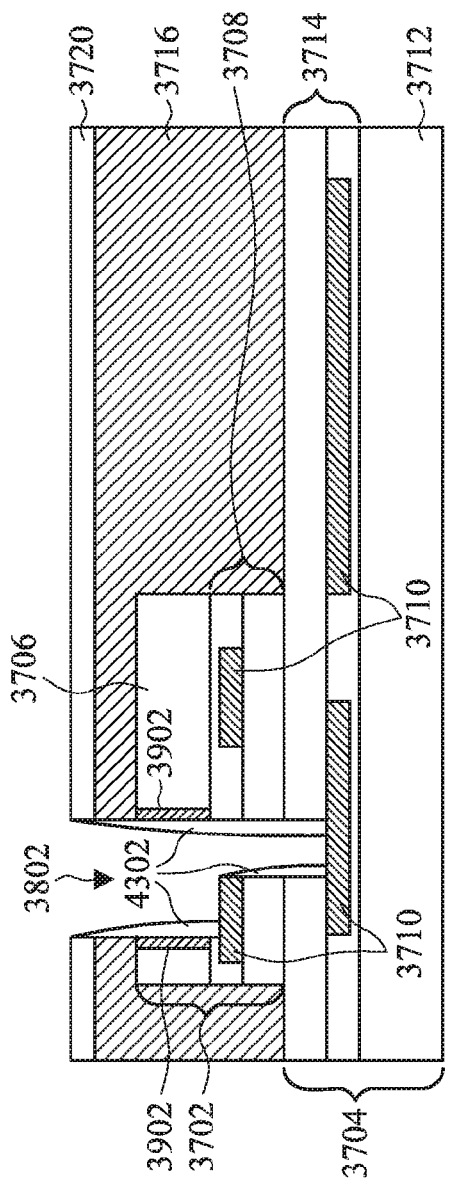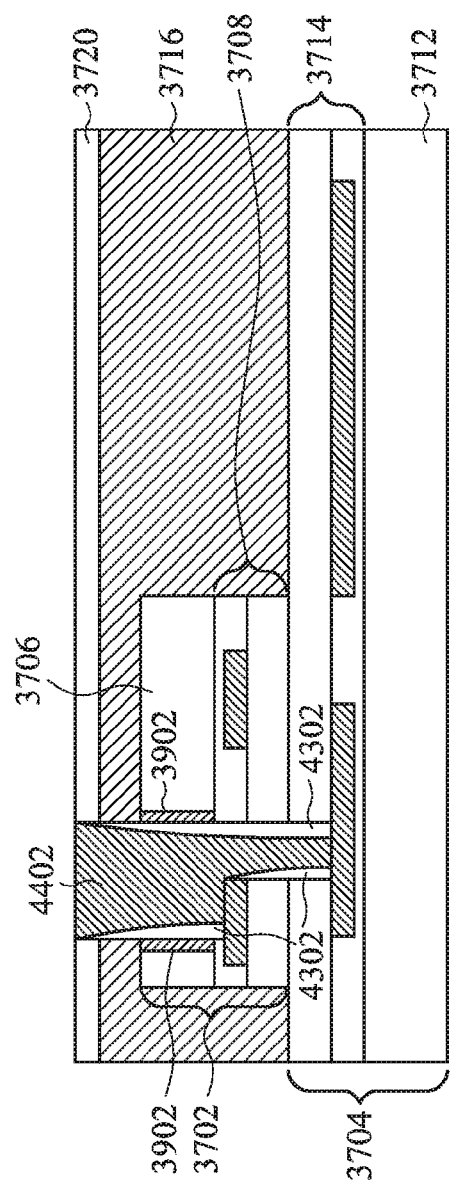

3D CHIP-ON-WAFER-ON-SUBSTRATE STRUCTURE WITH VIA LAST PROCESS

PRIORITY CLAIM AND CROSS-REFERENCE

This application is a continuation-in-part of U.S. patent application Ser. No. 14/444,681, filed Jul. 28, 2014, entitled "3d Chip-On-Wafer-On-Substrate Structure With Via Last Process," which claims the benefit of U.S. Provisional Application No. 61/991,287, filed on May 9, 2014, titled "3D Chip-on-Wafer-on-Substrate Structure with Via Last Process," which applications are hereby incorporated by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. An electrical connection may be provided between the stacked semiconductor wafers. The stacked semiconductor devices may provide a higher density with smaller form factors and allow for increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 31-36 illustrate cross-sectional views of intermediate processing steps in forming a chip-on-wafer structure using a via last process according to another embodiment;

FIGS. 37-44 illustrate cross-sectional views of intermediate processing steps in forming a chip-on-wafer structure using a via last process according to yet another embodiment.

DETAILED DESCRIPTION

Figure 1:
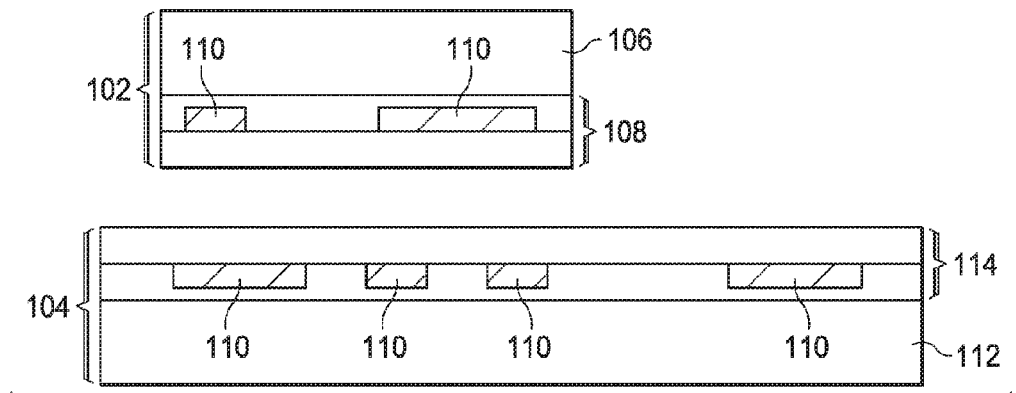
FIGS. 1-15 illustrate cross-sectional views of intermediate processing steps in forming a chip-on-wafer structure using a via last process according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices are bonded together to form packages with various capabilities. In some processes, dies, wafers or a combination of dies and wafers, are bonded together using direct surface bonding such as oxide-to-oxide bonding, through hybrid bonding, or the like. It has been discovered that interconnections between bonded wafers can be provided using a via last process. In the via last process, the vias are formed through one of the dies after the dies have been bonded to provide electrical connection between the dies, and to provide power and data connections between the dies and external connectors. It has been further discovered that conductive vias formed through the substrate of one or more dies can be insulated from the substrate by using a self-aligning insulating spacer on the sidewalls of the via openings. The self-aligning spacer on the sidewalls permits narrower, taller vias, and improves the aspect ratio of the vias to between about 3 and about 10. The improved aspect ratio results in more compactly arranged via arrays.

FIG. 1 illustrates a cross-sectional view of a wafer 104 and die 102 prior to bonding according to an embodiment. A die 102 comprises a die substrate 106 such as a semiconductor having one or more active devices formed therein. A die redistribution layer (RDL) 108 is disposed on the die substrate 106. The die RDL 108 comprises one or more dielectric layers with conductive elements 110 disposed in the dielectric layers. The die RDL 108 is formed over the side of the substrate having the active devices, with the conductive elements 110 connecting to the active devices on the die substrate 106.

The wafer 104 has a wafer RDL 114 disposed over a wafer substrate 112. In some embodiments, the wafer substrate 112 is a semiconductor with one or more active devices formed therein. The wafer RDL 114 is formed over the active devices in the wafer substrate 112 and has one or more conductive elements 110 disposed in dielectric layers.

Figure 2:
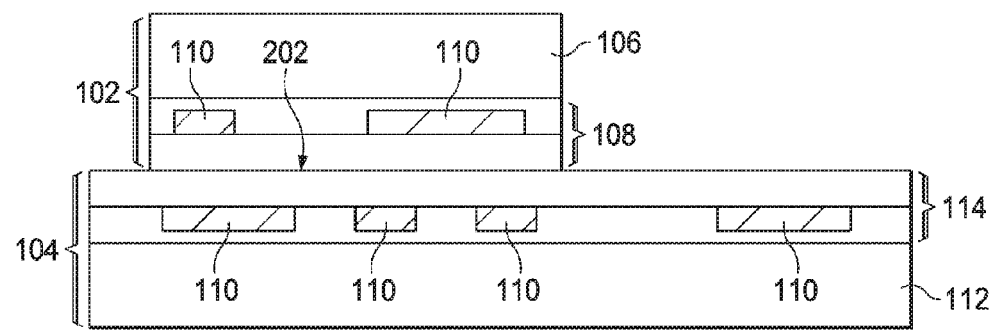

FIG. 2 illustrates a cross-sectional view of a processing step for bonding a wafer according to an embodiment. The die 102 and wafer 104 are bonded at the top surfaces of the RDLs 108 and 114, forming a bond interface 202. The die 102 and wafer 104 are used as the basis for a package having connections for mounting the package to external devices, substrates, or the like. In some embodiments, the die 102 is bonded to the wafer 104 by, for example, direct surface bonding, metal-to-metal bonding, hybrid bonding, or another bonding process. A direct surface bonding process creates an oxide-to-oxide bond or substrate-to-substrate bond through a cleaning and/or surface activation process followed by applying pressure, heat and/or other bonding process steps to the joined surfaces. In some embodiments, the die 102 and wafer 104 are bonded by metal-to-metal bonding that is achieved by fusing conductive elements 110, such as metal bond pads, exposed at the surfaces of the RDLs 108 and 114. In other embodiments, hybrid bonding is used to bond the die 102 and wafer 104 by a combination of direct surface bonding and metal-to-metal bonding, where both the surfaces of the RDLs 108 and 114 and the surfaces of metal bond pads exposed at the surfaces of the RDLs 108 and 114 are bonded. In some embodiments, the bonded dies are baked, annealed, pressed, or otherwise treated to strengthen or finalize the bond.

Figure 3:
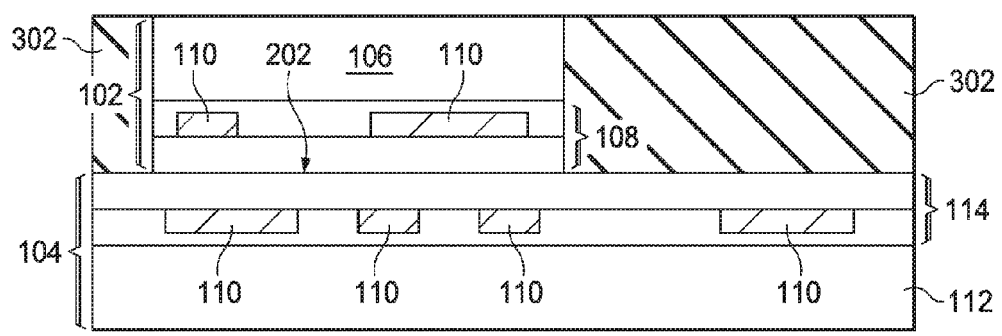

FIG. 3 is a cross-sectional view of forming insulating film 302 over the package according to an embodiment. The insulating film 302 is formed around the die 102 and on the wafer RDL 114. In some embodiments, the insulating film 302 is a molding compound shaped or molded using for example, a mold (not shown) which may have a border or other feature for retaining insulating film 302 when applied. Such a mold may be used to pressure mold the insulating film 302 around the die 102 to force the insulating film 302 into openings and recesses, eliminating air pockets or the like in the insulating film 302. In an embodiment, the insulating film 302 is a nonconductive or dielectric material, such as an epoxy, a resin, a moldable polymer such as PBO, or another moldable material. For example, insulating film 302 is an epoxy or resin that is cured through a chemical reaction or by drying. In another embodiment, the insulating film 302 is an ultraviolet (UV) cured polymer. In other embodiments, a dielectric or insulating film comprising an oxide, nitride, or the like is formed over the package. In such embodiments, the oxide or nitride insulating film is a silicon nitride, silicon oxide, silicon oxynitride, or another dielectric material, and is formed by chemical vapor deposition (CVD), plasma enhanced CVD (PECVD) or another process.

After the insulating film 302 is formed over the die 102 and wafer 104, the insulating film 302 is reduced or planarized by, for example, grinding, a chemical-mechanical polish (CMP), etching or another process. For example, where the insulating film 302 is an insulating film such as an oxide or a nitride, a dry etch or CMP is used to reduce or planarize the top surface of the insulating film 302. In some embodiments, the insulating film 302 extends over the die 102 after planarization, and in other embodiments, the insulating film 302 is reduced so that the die 102 is exposed with a top surface substantially planar with the top surface of the insulating film 302. The die substrate 106 is, in some embodiment, thinned or reduced in the same process as the insulating film, resulting in a die 102 backside surface that is substantially planar with the insulating film surface.

Figure 4:
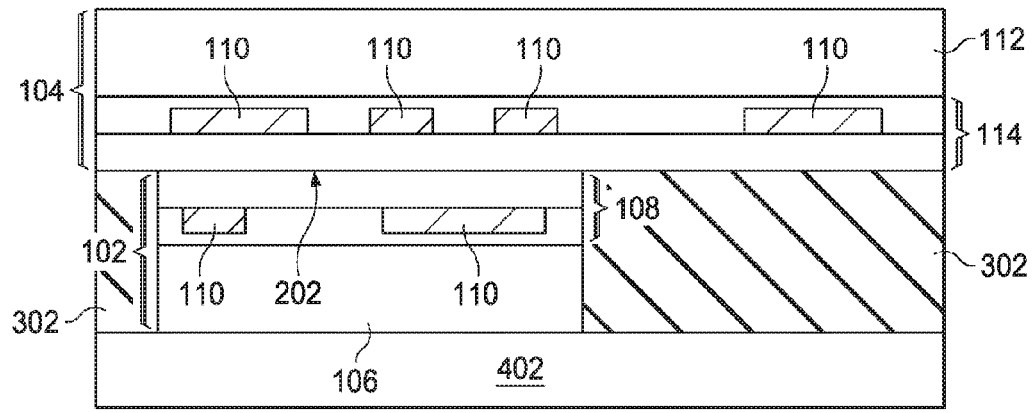

FIG. 4 is a cross-sectional view of mounting the package to a carrier 402 according to an embodiment. The package is inverted to permit access to, and processing through the wafer substrate 112. The die 102 and insulating film 302 surface are bonded to, for example, a glass carrier, or other handling substrate. The package is attached to the carrier 402 using die attachment film (DAF), an adhesive, or the like. In other embodiments, the package is attached to the carrier 402 with the wafer substrate 112 on the carrier 402, permitting processing of the package through the die side of the package. In some embodiments, the wafer substrate 112 is also thinned or reduced by grinding, CMP, etching or another process.

Figure 5:
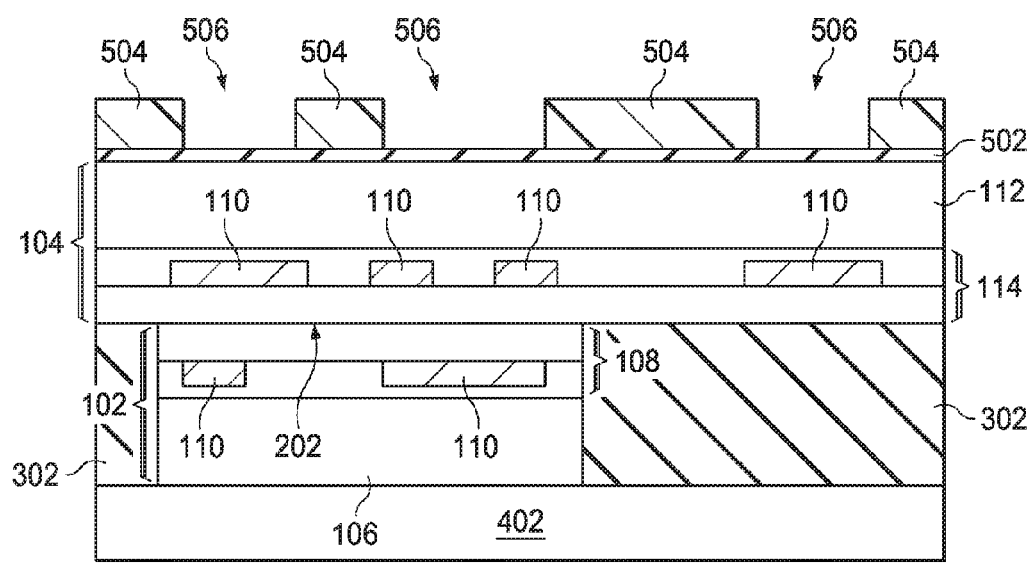

FIG. 5 is a cross-sectional view illustrating masking the wafer substrate 112 according to an embodiment. An etch stop layer 502 is formed on the wafer substrate 112, and is formed from a material that has a high etch selectivity compared to the material of the wafer substrate 112. Additionally, the etch stop layer 502 has a high etch selectivity compared to the wafer RDL 114 and die RDL 108. In some embodiments where the wafer substrate 112 is, for example, silicon and the RDLs 114 and 108 are silicon oxide, the etch stop layer 502 is a nitride such as silicon nitride (SiN), a carbide such as silicon carbide (SiC) or an oxynitride such as silicon oxynitride (SiON), or another etch stop material. In such an embodiment, the etch stop layer is deposited using CVD, PECVD, physical vapor deposition (PVD), epitaxy, a spin-on process, or another deposition process.

A mask 504 is formed over the etch stop layer 502 and is patterned to form openings 506 exposing portions of the etch stop layer 502. The mask 504 is, in some embodiments, a photoresist that is deposited, exposed and developed. The openings 506 in the mask 504 are aligned over conductive elements 110 in the RDLs 108 and 114.

Figure 6:
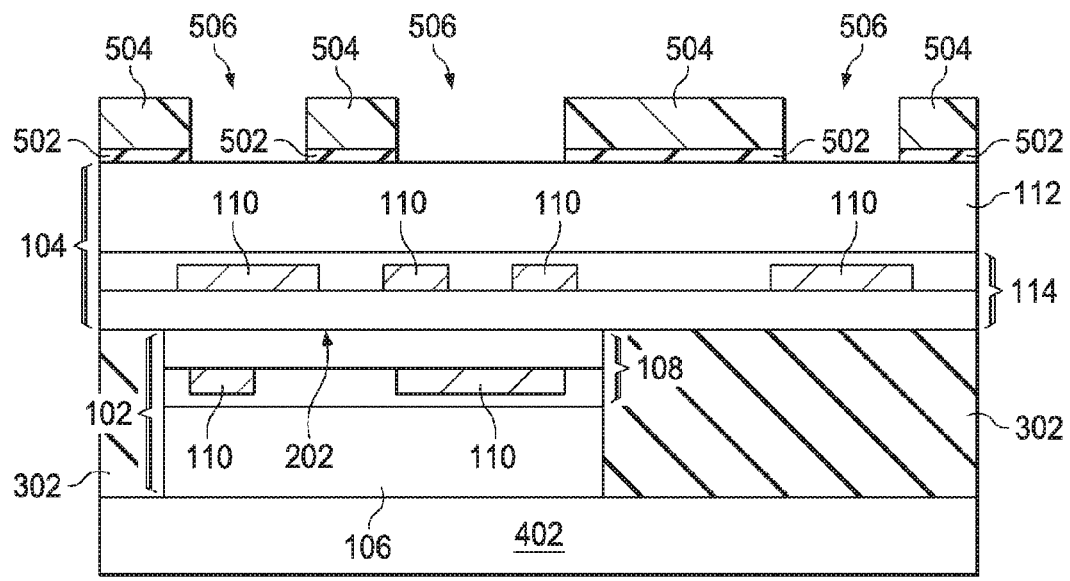

FIG. 6 is a cross-sectional view illustrating etching of the etch stop layer 502 according to an embodiment. The etch stop layer 502 is etched to expose the wafer substrate 112. In some embodiment, the etch stop layer 502 is etched with a dry plasma etch, such as an oxygen or nitrogen plasma with a fluorine based etchant such as carbon tetrafluoride ($CF_4$) or sulfur hexafluoride ($SF_6$). In other embodiments, the etch stop layer 502 is etched by a wet etch, using for example, sulfuric acid ($H_2SO_4$) heated phosphoric acid ($H_3PO_4$), or the like.

Figure 7:
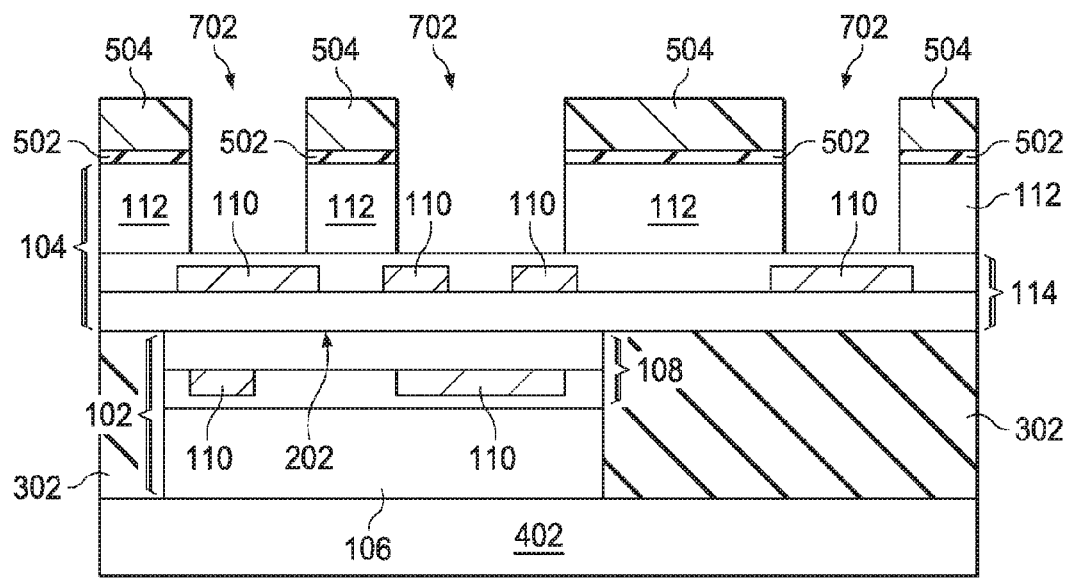

FIG. 7 is a cross-sectional view illustrating etching of the wafer substrate 112 according to an embodiment. The wafer substrate 112 is etched anisotropically to form via openings 702 with substantially vertical walls. In some embodiments, the wafer substrate 112 is etched in a separate process step from etching the etch stop layer 502, permitting the etch stop layer 502 to act as a hard mask for etching the wafer substrate 112. For example, where the wafer substrate 112 is silicon, the wafer substrate 112 is dry plasma etched with a chlorine based etchant, such as gaseous chlorine ($Cl_2$) or wet etched with potassium hydroxide (KOH) or a nitric acid/hydrofluoric acid ($HNO_3$/HF) mix. Additionally, the wafer substrate 112 is selectively etched, with the etch stopping at the wafer RDL 114.

Figure 8:
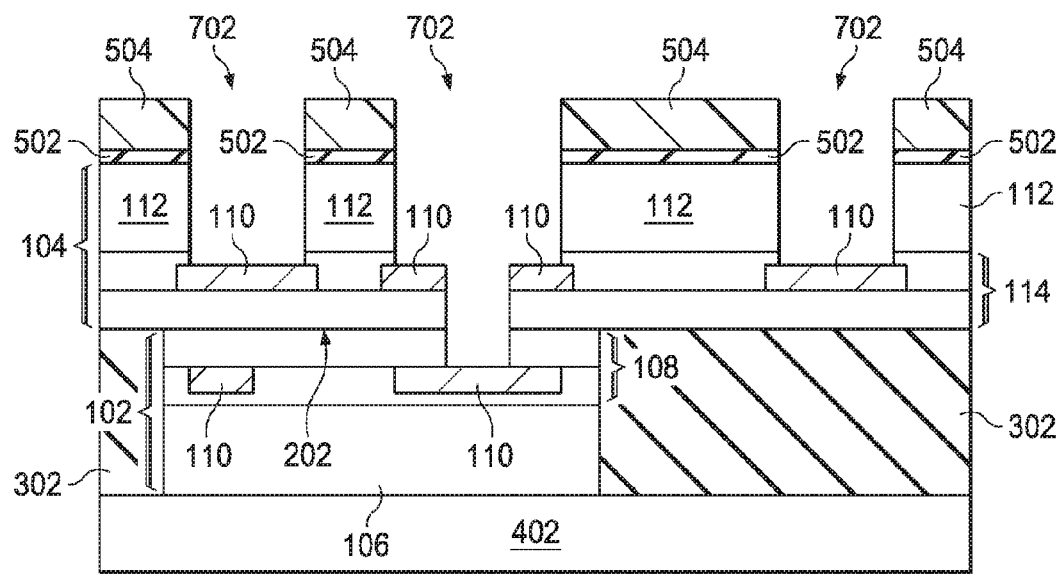

FIG. 8 is a cross-sectional view illustrating etching of the oxide layers of the RDLs 108 and 114. The oxide layers are, in an embodiment, etched using a buffered oxide etch (BOE)

comprising ammonium fluoride (NH$_4$F) and hydrofluoric acid. Conductive elements 110 in the oxide layers of the RDLs 108 and 114 act as an etch stop layer, permitting etching of the RDLs 108 and 114 to different depths. Etching the oxide layers extends the via openings 702 to conductive elements 110 in the RDLs 108 and 114. In some embodiments, a via opening 702 extends through an opening in an upper conductive element 110 and exposes a surface of a lower conductive element 110. Thus, a single via opening 702 can expose surfaces of multiple conductive elements 110. Additionally, in some embodiment, the via openings 702 expose conductive elements 110 in the die RDL 108 and the wafer RDL 114.

Figure 9:
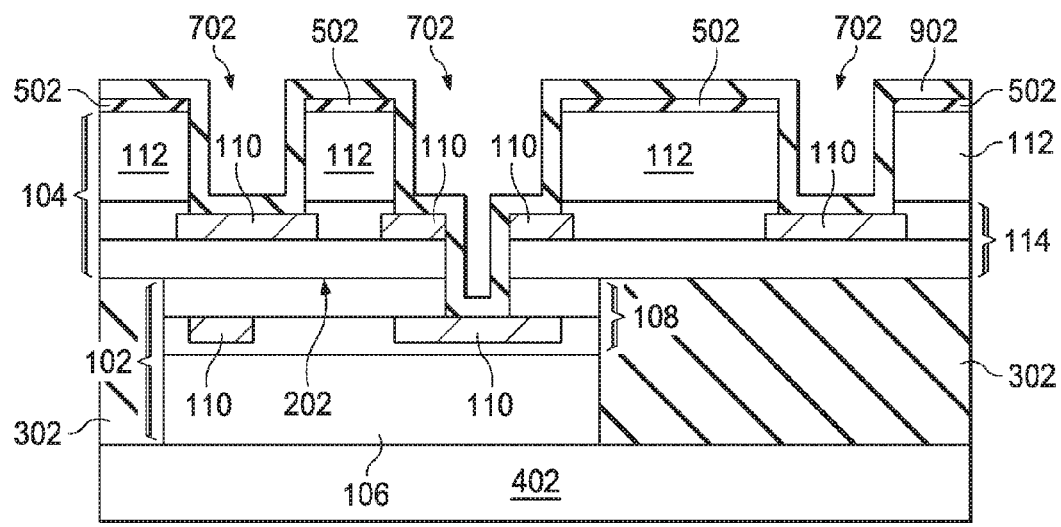

FIG. 9 is a cross-sectional view illustrating formation of an isolation layer 902 according to an embodiment. The mask 504 (see FIG. 7) is removed, and a conformal dielectric isolation layer 902 is formed over the etch stop layer 502. The isolation layer 902 extends into each of the via openings 702 and covers the sidewalls of the via openings 702, including the portions of the wafer substrate 112 exposed in the via openings 702.

In an embodiment, the isolation layer 902 is formed from silicon nitride, for example, using a CVD or PECVD process. In other embodiments, the isolation layer 902 is formed from an oxide, another nitride, a carbide, an oxynitride, spin on glass (SOG) or another dielectric or electrical insulating material. The thickness of the isolation layer 902 is determined, in part, by the intended voltage on vias that will be formed in the via openings 702. It has been determined that a thickness between about 500 angstroms and about 5000 angstroms will provide a thickness that results in a breakdown voltage that is greater than about 3.8 volts.

Figure 10:
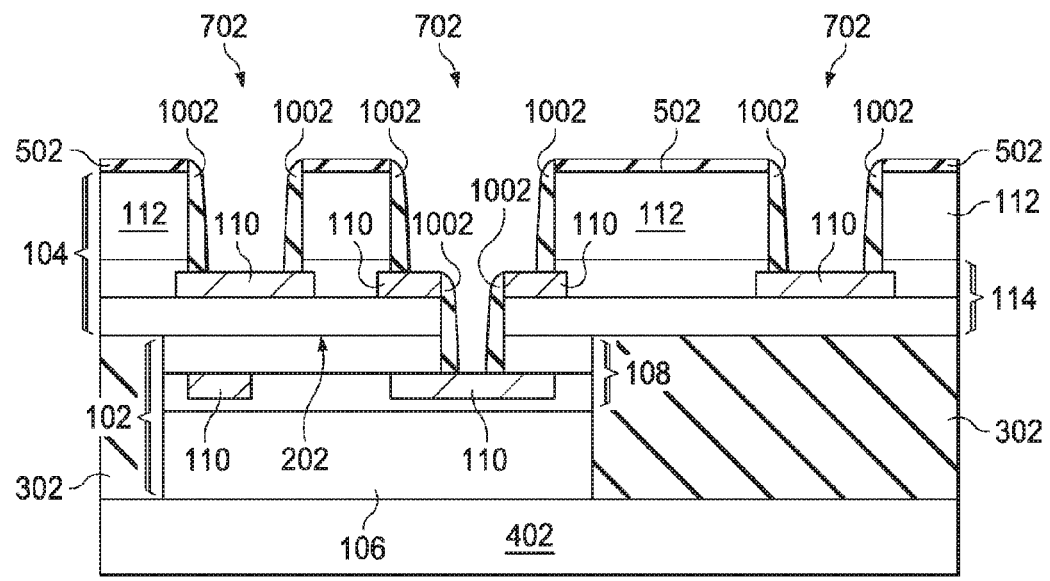

FIG. 10 is a cross-sectional view illustrating formation of self-aligning spacers 1002 according to an embodiment. The isolation layer 902 (see FIG. 9) is etched, using for example, a dry plasma etch with chlorine, sulfur hexafluoride, carbon tetrafluoride, chlorine or another etchant in an argon (Ar), helium (He) or other environment. In some embodiments, the etchant is provided with, for example, oxygen (O$_2$), nitrogen (N$_2$) or other process gasses to increase the selectivity of the etch. In such an etch, the environment is maintained between about 25° C. and about 150° C. at a pressure between about 10 mtorr and about 200 mtorr. In some embodiments, the etch is anisotropic, removing material in a vertical direction. Thus, the etch removes material of the isolation layer 902 from the horizontal surfaces of the package, leaving spacers 1002 on the sidewall surfaces of the package. For example, portions of the isolation layer 902 disposed on the etch stop layer 502 are removed while portions of the isolation layer 902 disposed on the sidewalls of the via openings 702 remain. This is due to the thickness of the isolation layer 902 in the vertical direction being greater where at the sidewalls than at the horizontal surfaces. Additionally, the portions of the top surfaces of the conductive elements 110 are exposed during the etch. This is due to the isolation material being removed substantially from the top direction, as the directional etching of the isolation layer 902 reduces the top surface of the isolation layer 902, eliminating the lateral portions of the isolation layer 902 and leaving the vertical portions.

It has been discovered that self-aligning spacers 1002 can be formed within the via openings 702, and that the self-aligning feature of the spacers 1002 causes the spacers 1002 to form on the sidewalls of the via openings 702. The spacers 1002 insulate the material forming the sidewalls of the via openings 702 from vias formed in the via openings 702. In particular, the spacers 1002 form on the sidewalls of the via openings 702 where the via opening 702 passes through the wafer substrate 112, with the outer surfaces of the spacers 1002 disposed on the sidewalls of the via openings 702, and with the inner surfaces of the spacers 1002 facing the interior of the via openings 702. The spacers 1002 permit a conductive via to be formed in the via opening 702 while avoiding electrical contact with the vertical surfaces of the wafer substrate 112 and RDLs 108 and 114. In some embodiments, the spacers 1002 extend to an underlying conductive feature 110, shielding the via opening 702 from all of the sidewalls of the via openings 702. Additionally, the spacers 1002 leave portions of the lateral surfaces of the conductive elements 110 exposed in the via openings 702 so that a subsequently formed via can come into electrical contact with the conductive elements 110. Thus, some of the spacers extend below the bottommost surface of the wafer substrate 112 into the RDLs 108 and 114, with the inner surfaces of the spacers 1002 extending contiguously from the conductive element 1002 to the top surface of the wafer substrate 112, or over the top surface of the wafer substrate.

In some embodiments where a via opening 702 is formed over or through an upper conductive element 110 to a lower conductive element 110, the via opening 702 has an upper portion with a wider width than a lower portion of the via opening 702. In such an embodiment, separate spacers 1002 are formed on the sidewalls of the upper and lower portions of the via openings 702, with the upper and lower spacer 1002 laterally spaced apart to expose the lateral surfaces of the upper conductive element 110.

Figure 11:
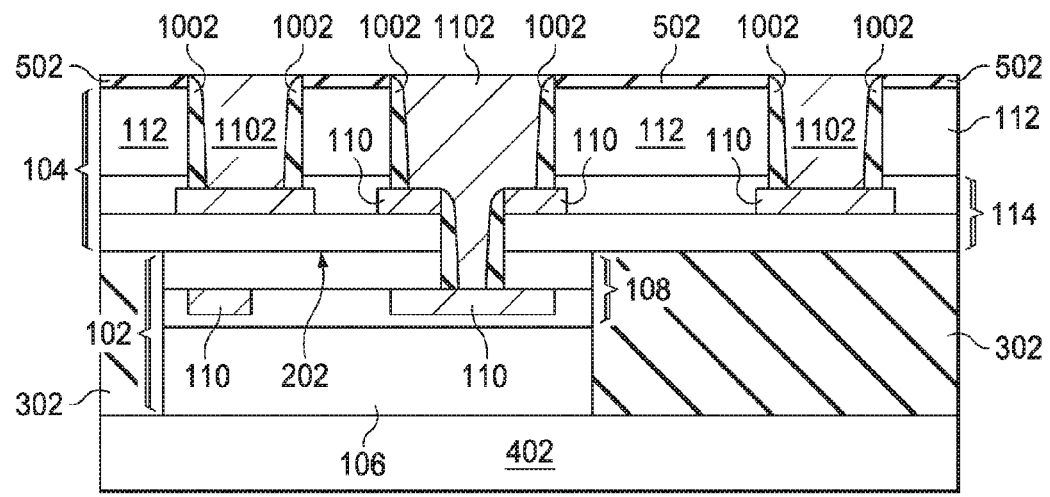

FIG. 11 is a cross-sectional view illustrating formation of vias 1102 in the via openings 702 according to an embodiment. As the vias 1102 are formed after bonding the die 102 to the wafer 104, this process is referred to as a via last process. In some embodiments, vias 1102 that extend through a substrate such as the wafer substrate 112 are referred to as through substrate vias (TSVs) or alternatively, as through silicon vias for vias extending though a silicon substrate. Vias 702 that extend through the insulating film 302 are referred to as through dielectric vias (TDVs).

In some embodiments, a barrier layer (not shown for clarity) is formed in the via openings 702, with the barrier layer formed from, for example, cobalt (Co), tantalum, tungsten, tantalum nitride (TaN), titanium nitride (TiN), or the like by CVD, PECVD or another deposition process. Vias 1102 are created by filling the via openings 702 with a conductive material such as copper (Cu) aluminum (Al), aluminum copper alloy (AlCu), gold, titanium, cobalt, an alloy, or another conductive material. In some embodiments, the vias are formed through, for example, electrochemical plating (ECP), electroplating, electroless plating or another process. In such embodiments, a seed layer (not shown) is formed over the barrier layer or over the spacers and conductive elements 110 by for example, atomic layer deposition. The seed layer provides nucleation sites for the plating process and increases the uniformity of the plated material that forms the vias 1102. In some embodiments, the conductive material of the vias 1102 extends over the via openings 702. Such overfilling is used, for example, to ensure that the openings 702 are completely filled. Excess material is removed by grinding, CMP, polishing, etching or another reduction process. After formation of the vias 1102, the top surfaces of the vias 1102 are substantially planar with the top surface of the etch stop layer 502. In some embodiments, the grinding process removes the etch stop layer 502 or reduces the top surface of the wafer substrate 112.

The vias 1102 extend through the wafer substrate 112 to contact one or more conductive elements 110. The spacers 1002 electrically insulate the vias 1102 from the wafer substrate 112 so that electrical signals sent through the vias 1102 do not interfere with active devices in the wafer substrate 112. In some embodiments, a via 1102 extends through the wafer substrate 112, the wafer RDL 114, and bond interface 202 to contact a conductive element 110 in the die RDL 108. In such an embodiment, the conductive element 110 on the die RDL 108 is electrically connected to the die substrate 106 through the die RDL 108. Thus, a connection between the die substrate 106 and an external device or connection may be formed from the wafer side of the package. Similarly, in some embodiments, a via 1102 extends through the wafer substrate 112 and contacts a conductive element 110 in the wafer RDL 114 that is electrically connected to the wafer substrate 112. Thus, power or data connections can be provided from the die 102 or wafer 104 through the wafer substrate 112 to an external device.

Additionally, in some embodiments, the wafer 104 can be electrically connected to the die 102 using the via last process. For example, a first conductive element 110 in the wafer RDL 114 and a second conductive element 110 in the die RDL 108 can be connected by a via 1102 that contacts both the first and second conductive elements 110. Thus, even though the RDLs 108 and 114 are between the die 102 and wafer 104, external electrical connectivity and die-to-wafer connectivity can be provided without discrete connectors such as microbumps or solder balls formed prior to bonding the die 102 to the wafer 104. Additionally, the via last process eliminates the requirements for aligning the wafer to the die during the die-to-wafer bonding process.

It has been discovered that the spacers 1002 provide a lower cost and simpler structure for chip-on-wafer structures. Additionally, the spacers 1002 permit a height-to-width aspect ratio for the vias that is between 3 and about 10, increasing the density of inter-chip connections. It has been further discovered that, with the vias 1102 extending through the wafer substrate 112, the vias 1102 can be arranged through the package more regularly and provide a more heterogeneous chip stack. The regular arrangement of the vias 1102 also provides improved warpage control during subsequent processing or package mounting.

Figure 12:
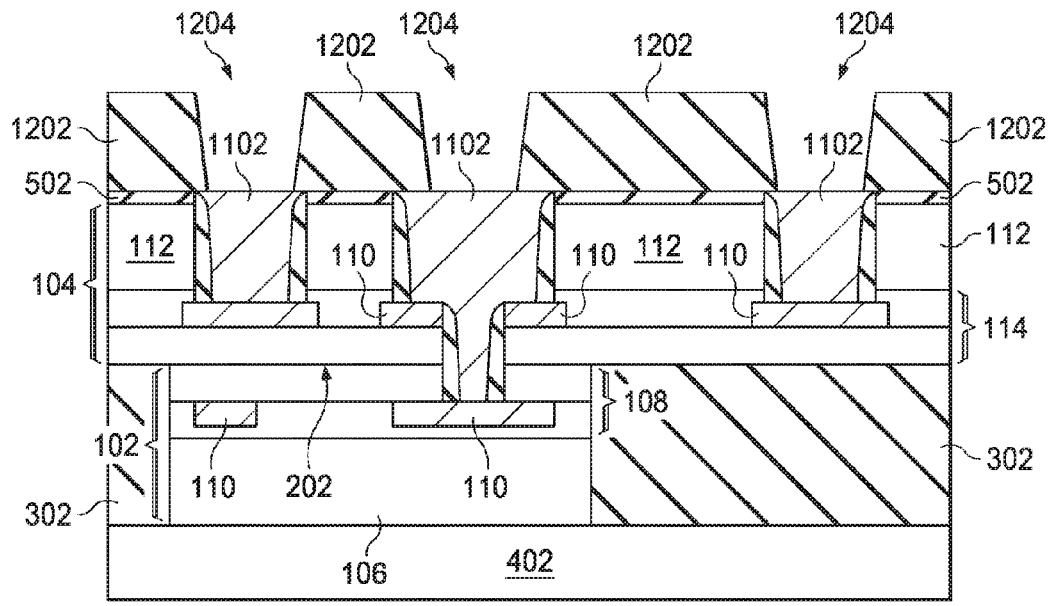

FIG. 12 is a cross-sectional view illustrating a top RDL insulating layer 1202. In some embodiments, an insulating material such as PBO, silicon oxide, polyimide, or another insulating material is formed over the etch stop layer 502. One or more RDL openings 1204 are formed in the insulating layer 1202 exposing the vias 1102. In some embodiment, insulating layer 1202 is PBO that is sprayed on or spun on, and the RDL openings 1204 are formed by exposing and developing the PBO with a photolithographic process. In other embodiments, the insulating layer 1202 is deposited by CVD or the like and etched, laser drilled, milled, or otherwise patterned.

Figure 13:
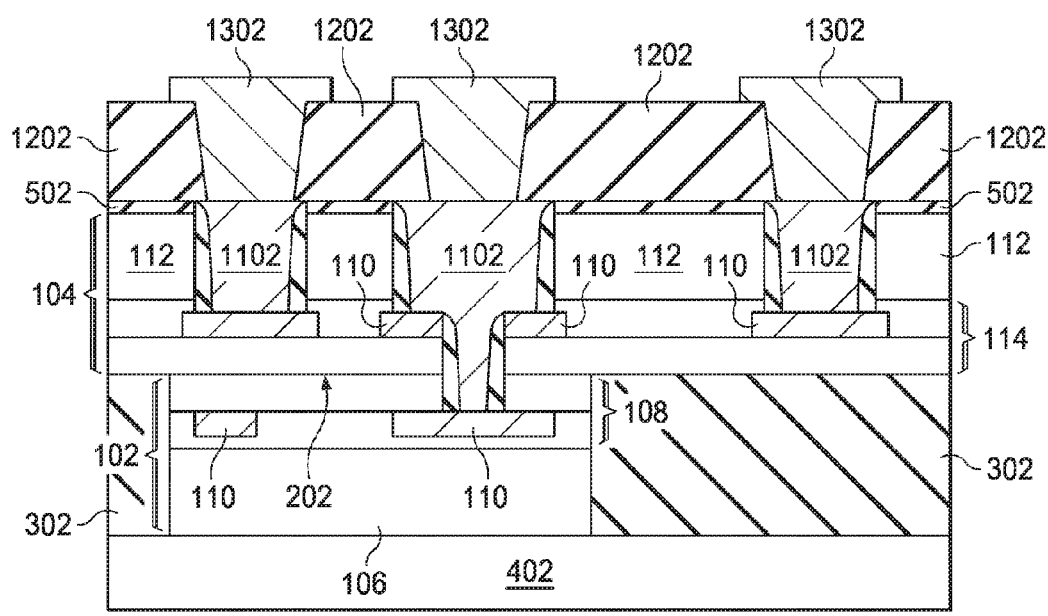

FIG. 13 is a cross-sectional view illustrating formation of top RDL conductive elements 1302 in the top RDL insulating layer 1202 according to an embodiment. A conductive material, such as copper, is deposited over the insulating layer 1202 in the RDL openings 1204 through, for example, sputtering, PVD, CVD, plating or another deposition process. The deposited conductive material is patterned by masking and etching or by masking prior to deposition. While the illustrated top RDL conductive elements 1302 are shown extending substantially vertically for clarity, it should be understood that in some embodiments, the top RDL conductive elements 1302 have portions that extend laterally to provide a desired layout for subsequently formed layers or connectors.

Figure 14:
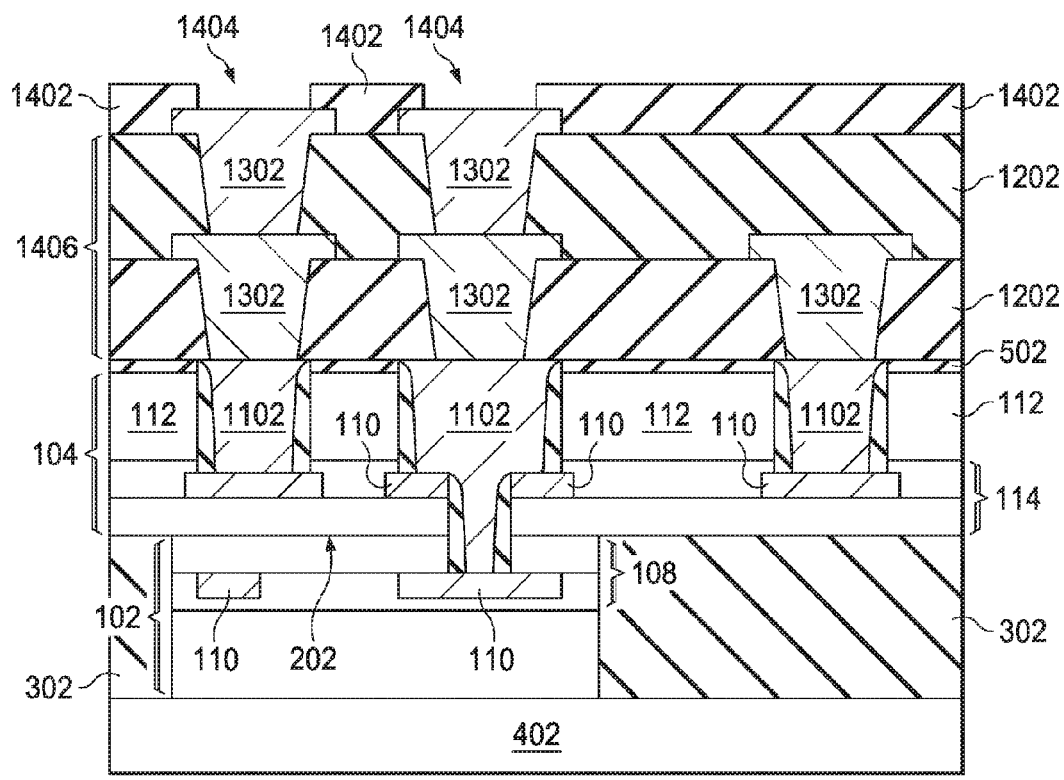

FIG. 14 is a cross-sectional view illustrating formation of additional insulating layers and conductive elements to form the top RDL 1406. One or more top RDL insulating layers 1202 with conductive elements 1302 are formed in a stack to provide electrical connectivity between external devices and the vias 1102. Additionally, a protective layer 1402 is formed over the uppermost top RDL insulating layer 1202 and has openings exposing the top RDL conductive elements 1302. In some embodiments, the protective layer 1402 is PBO, an epoxy, an oxide, a nitride, a carbide, an oxynitride, a polyimide, or another insulating or protective material and is deposited and patterned as described above.

Figure 15:
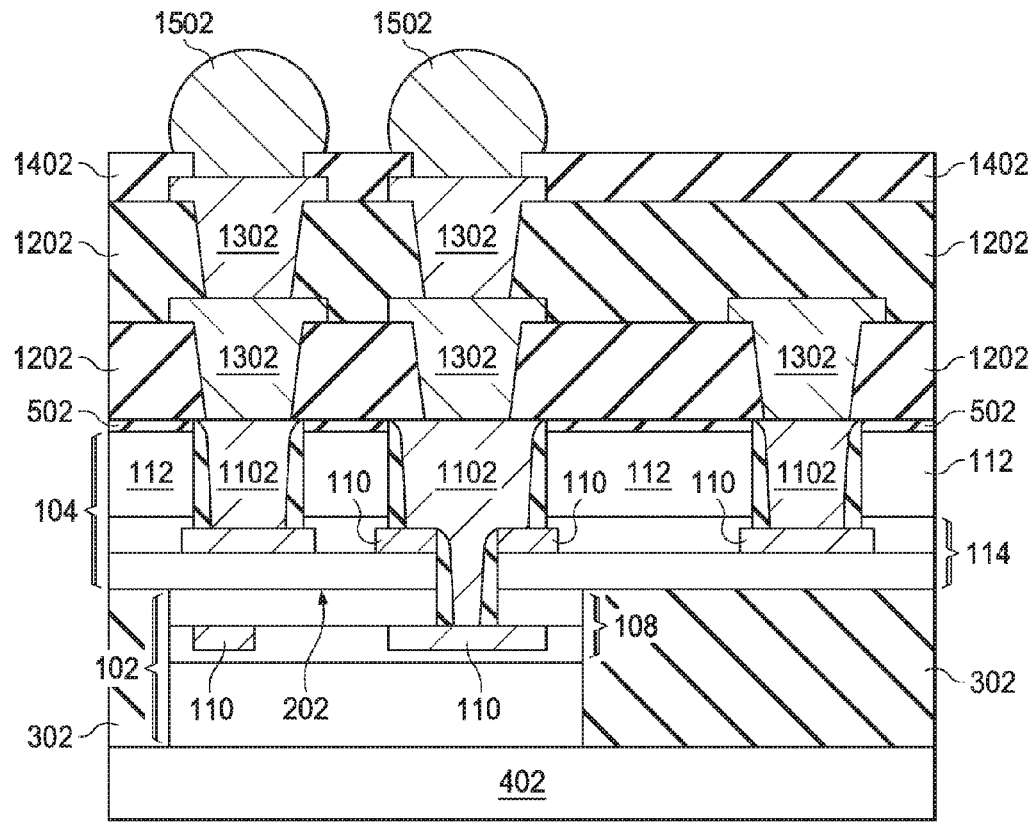

FIG. 15 is a cross-sectional view illustrating formation of connectors 1502 according to an embodiment. One or more connectors 1502 are mounted on exposed portions of the top RDL conductive elements 1302. In some embodiments, the connectors 1502 are solder balls, pillars, conductive bumps or another conductive connector. The connectors 1502 are configured to permit mounting of the package to a target substrate such as a die, package, wafer, PCB or the like. Thus, the wafer 104 and die 102 would be in signal connectivity with the target substrate though the connectors 1502 and vias 1102. The carrier 402 then removed from the package.

While the chip-on-wafer package is shown using the via last process to form vias 1102 that extend from the wafer side of the package through the wafer substrate 112 to the RDLs 108 and 114, it should be understood that the disclosed embodiments are not limited to such an arrangement. In other embodiments, vias 1102 are formed from the die side of the package through the die substrate 106 and insulating film 302 to the RDLs 108 and 114. Additionally, in some embodiments, the vias 1102 are formed from both the wafer side and die side of the package.

Additionally, the embodiments disclosed above are not limited to the order of steps and structure described above. FIGS. 16 through 20 illustrate cross-sectional views of intermediate processing steps in forming a ship-on-wafer structure having partial height self-aligning spacers according to an embodiment.

Figure 16:
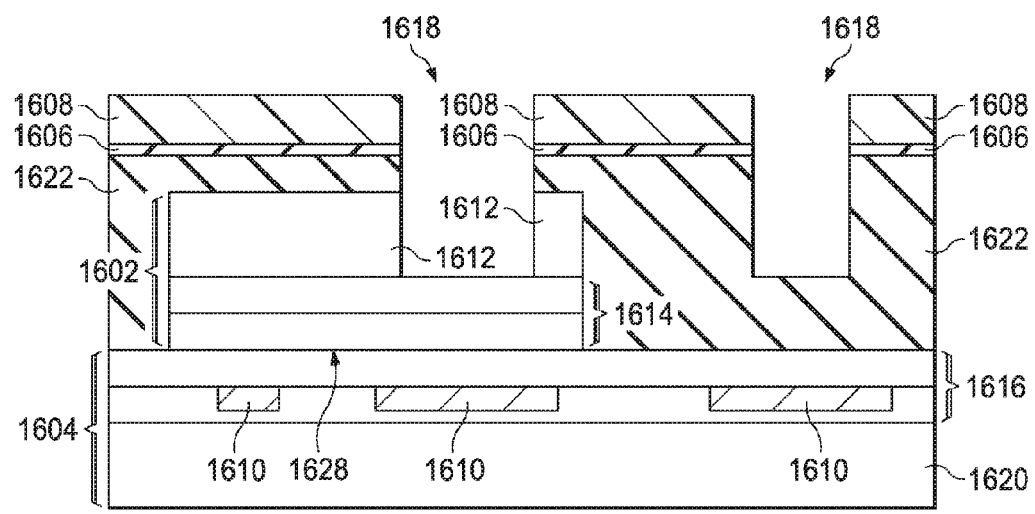
FIGS. 16-20 illustrate cross-sectional views of intermediate processing steps in forming a chip-on-wafer structure using via last process according to another embodiment.

FIG. 16 illustrates a cross-sectional view of masking and etching via openings 1618 in an insulating film 1622 of a package according to an embodiment. A die 1602 and wafer 1604 are bonded, for example, as described above. The die 1602 and wafer 1604 have a die substrate 1612 and wafer substrate 1620, respectively, and the substrates 1612 and 1620 have one or more active devices. A die RDL 1614 and wafer RDL 1616 are disposed on the respective substrates 1612 and 1620 and comprise dielectric layers with conductive elements 1610 disposed therein, some of which are in contact with the active devices in the respective substrates 1612 and 1620. The die 1602 and wafer 1604 are bonded together so that the die RDL 1614 and wafer RDL 1616 are in contact and form a bond interface 1628. In some embodiments, the die 1602 and wafer 1604 are bonded with a direct surface, metal-to-metal or hybrid bond as described above. The insulating film 1622 is formed over the die 1602, and in some embodiments, extends over the die 1602. An etch stop layer 1606 is formed over the insulating film 1622.

A mask 1608 is deposited over the etch stop layer 1606 and patterned with openings disposed over one or more of the conductive elements 1610. Via openings 1618 are etched through the insulating film 1622 using the mask 1608 to control the location of the via openings 1618. In an embodiment, the via openings 1618 extend through the insulating film 1622, and via openings 1618 disposed over the die substrate 1612 extend through the die substrate 1612 to the die RDL 1614. The via openings 1618 that are adjacent to, and not disposed over, the die substrate 1612 extend partially through the insulating film 1622.

Figure 17:
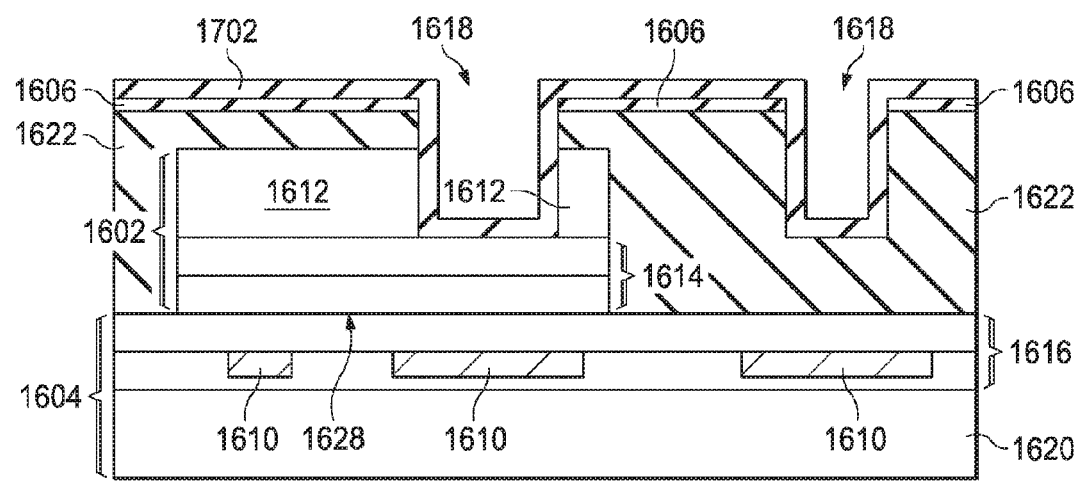

FIG. 17 is a cross-sectional view illustrating formation of an isolation layer 1702 according to an embodiment. The mask 1608 (see FIG. 16) is removed, and a conformal dielectric isolation layer 1702 is formed over the etch stop layer 1606. In an embodiment, the isolation layer 1702 is formed as described above. The isolation layer 1702 extends into each of the via openings 1618 and covers the sidewalls of the via openings 1618, including the portions of the die substrate 1612 exposed in the via openings 1618. Additionally, the isolation layer 1702 covers the lateral surfaces of, for example, the die RDL 1614 and the insulating film 1622 that are exposed at the bottoms of the openings 1618.

Figure 18:
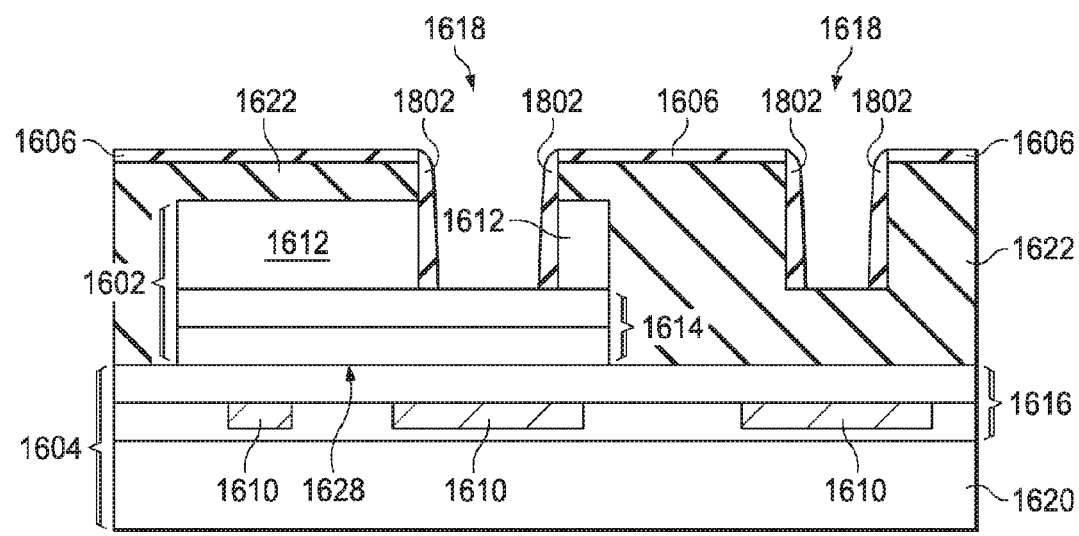

FIG. 18 is a cross-sectional view illustrating formation of partial height self-aligning spacers 1802 according to an embodiment. The isolation layer 1702 (see FIG. 17) is etched, in some embodiments, as described above. The etch exposes portions of the lateral surfaces of the die RDL 1614 in the via openings 1618 between the spacers 1802. Additionally, for the via openings 1618 that are adjacent to, and not disposed over, the die RDL 1616, the etch exposes the insulating film 1622 surface that forms the bottom of the via openings 1618.

Figure 19:
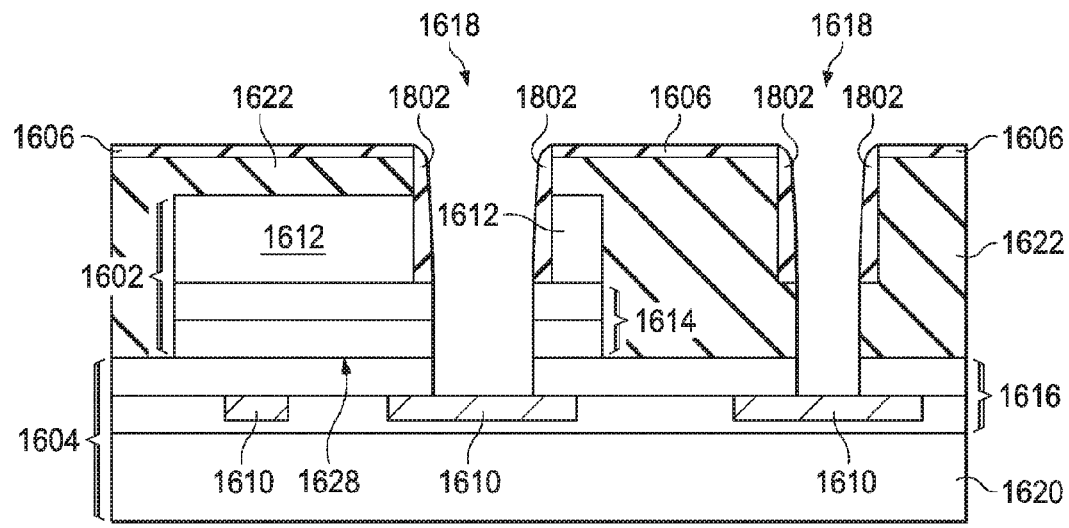

FIG. 19 illustrates a cross-sectional view of a second etch after formation of the spacers 1802 according to an embodiment. In some embodiments, the isolation layer 1702 a selectively etched as described above with respect to FIG. 8. The via openings 1618 are extended to underlying conductive elements 1610 in the RDLs 1614 and 1616, exposing an upper surface of the conductive elements 1610. In such an embodiment, the spacers 1802 extend only partially through the via openings 1618, with bottom surfaces of the spacers 1802 disposed on the die RDL 1614 or within the insulating film 1622. However, the spacers 1802 are disposed in the via openings 1618 on the sidewalls of the die substrate 1612, electrically insulating the die substrate 1612 from the via openings 1618 and subsequently formed vias. It has been discovered that the partial height self-aligning spacers 1802 permit etching of both the die RDL and the RDLs 1614 and 1616 with a single mask. The spacers 1802 mask the sidewalls of the die RDL 1614 during the second etch. The resulting via openings 1618 have a lower portion with sidewalls that are substantially planar, level, even or aligned with the inner surfaces of the spacers 1802. In some embodiments where the insulating film 1622 extends over the top surface of the die substrate 1012, the spacers 1802 extend from about the bottom surface of the die substrate 1612 to, or above, the top surface of the insulating film 1622.

Figure 20:
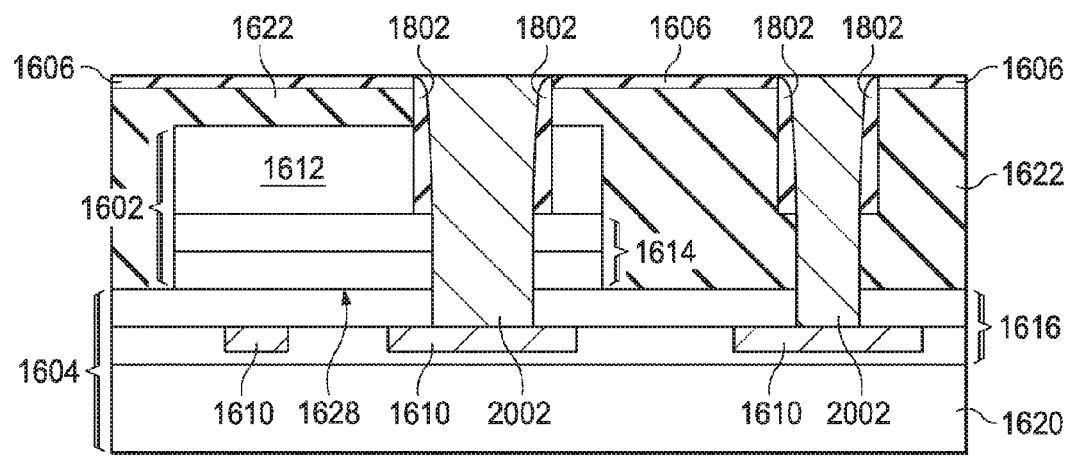

FIG. 20 illustrates a cross-sectional view of formation of the vias 2002 according to an embodiment. In some embodiments, vias 2002 are formed in the via openings 1618 (see FIG. 17) as describe above with respect to FIG. 11. The vias 2002 are insulated from the die substrate 1612 by the spacers 1802, and extend from the top surface of the package through the die substrate 1612 to conductive elements 1610 in the RDLs 1614 and 1616.

While the described embodiments is illustrated as having a partial height spacer 1802 insulating the vias 2002 from the die substrate 1612, the embodiments are not limited to those described. For example, in some embodiments, the partial height spacers 1802 are disposed in the wafer substrate 1620, with the vias 2002 extending to the RDLs 1614 and 1616 from the wafer side of the package.

Figure 21:
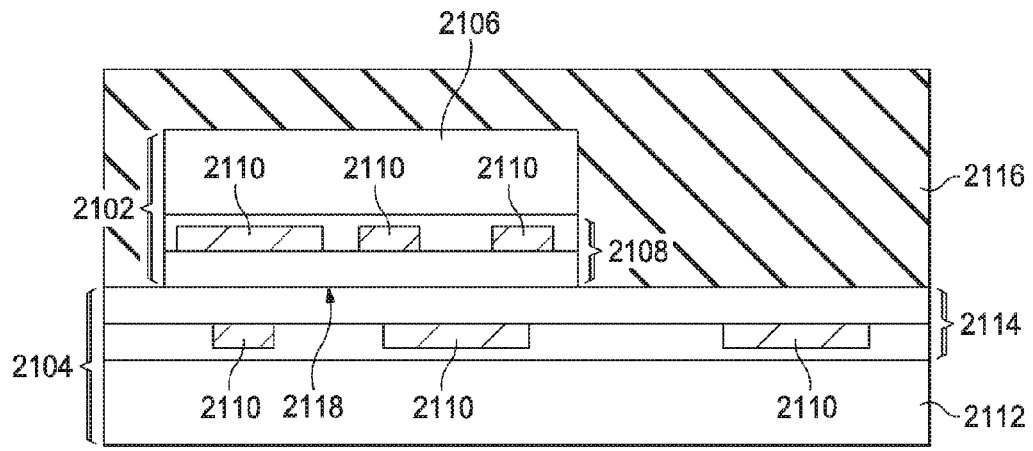
FIGS. 21-30 illustrate cross-sectional views of intermediate processing steps in forming a chip-on-wafer structure using a dual damascene via last process according to an embodiment.

FIGS. 21 through 30 illustrate cross-sectional views of intermediate processing steps in forming a chip-on-wafer structure using a dual damascene via last process according to an embodiment. FIG. 21 illustrates a cross-sectional view of formation of an insulating film 2116 over a die 2102 bonded to a wafer 2104 according to an embodiment. The die 2102 and wafer 2104 have, respectively, a die substrate 2106 and wafer substrate 2112 having one or more active devices. A die RDL 2108 and wafer RDL 2114 are disposed on the respective substrates 2106 and 2112 and comprise dielectric layers with conductive elements 2110 disposed therein, some of which are in contact with the active devices in the respective substrates 2106 and 2112. The die 2102 and wafer 2104 are bonded as described above so that the die RDL 2108 and wafer RDL 2114 are in contact and form a bond interface 2118. The insulating film 2116 is formed over the die 2102 and wafer 2104 as described above, and in some embodiments, extends over the die 2102.

Figure 22:
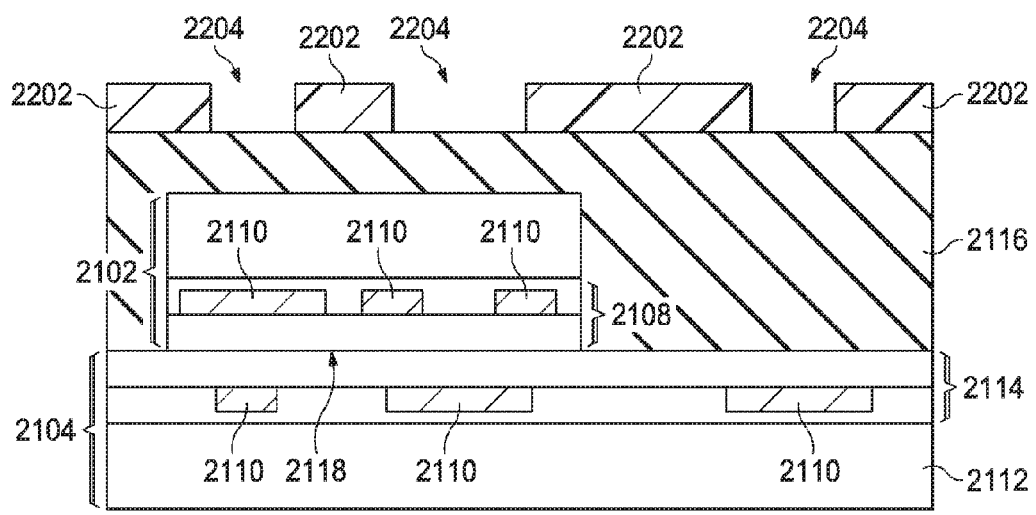

FIG. 22 illustrates a cross-sectional view of forming a first mask 2202 on the package according to an embodiment. In such an embodiment, the first mask 2202 is formed over the insulating film 2116 and is patterned to form openings 2204. The first mask 2202 is, in some embodiments, a photoresist that is deposited, exposed and developed. The openings 2204 in the first mask 2202 are aligned over conductive elements 2110 in the RDLs 2108 and 2114. It has been discovered that a dual damascene technique for forming via openings permits the elimination of an etch stop layer and associated etch of the etch stop layer. In such an embodiment, the first mask 2202 is disposed on the insulating film 2116.

Figure 23:
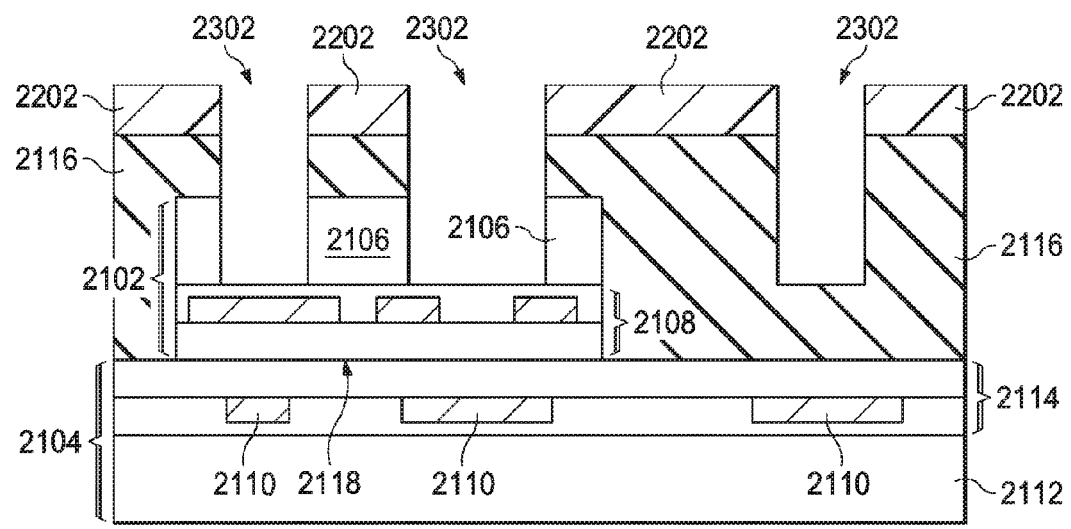

FIG. 23 illustrates a cross-sectional view of etching the die substrate 2106 according to an embodiment. Via openings 2302 are formed through the insulating film 2116, and through the die substrate 2106 to expose the die RDL 2108. In an embodiment, the via openings 2302 are etched as described above. Via openings 2302 that are adjacent to, and not disposed over, the die substrate 2106 extend partially through the insulating film 2116.

Figure 24:
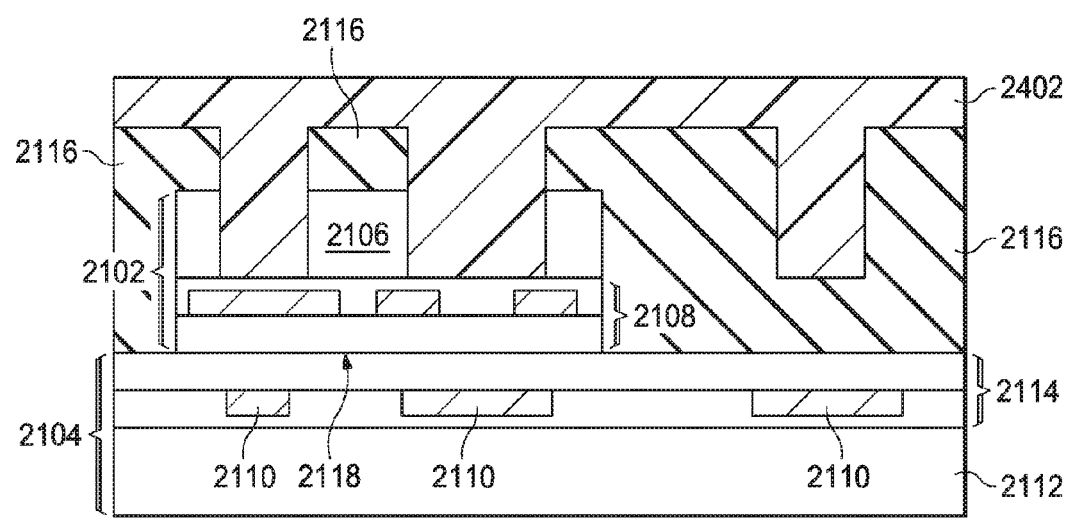

FIG. 24 illustrates a cross-sectional view of application of a second mask 2402 according to an embodiment. In some embodiments, after the first etch of the via openings 2302 through the die substrate 2106, the first mask 2202 is removed. A second mask 2402 is formed over the substrate extends into the via openings 2302. In some embodiments, the second mask 2402 is a photoresist deposited, by for example, spin coating, spray coating, or the like.

Figure 25:
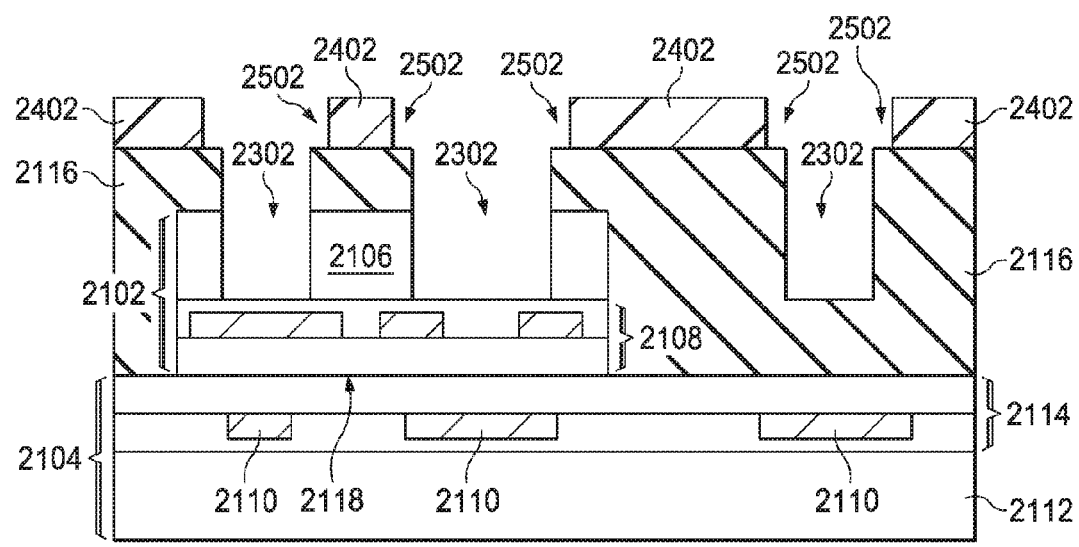

FIG. 25 illustrates a cross-sectional view of patterning the second mask 2402 according to an embodiment. In some embodiments, the second mask 2402 is exposed and developed to pattern the second mask 2402 with second mask openings 2502. In some embodiments, the second mask openings 2502 are wider than the via openings 2302 after the first etch, with the second mask openings 2502 disposed over the via openings 2302. Additionally, in some embodiments, the second mask openings 2502 define openings for metal lines that extend laterally from the via openings to provide electrical connectivity to vias subsequently formed in lower portions of the via openings 2302.

Figure 26:
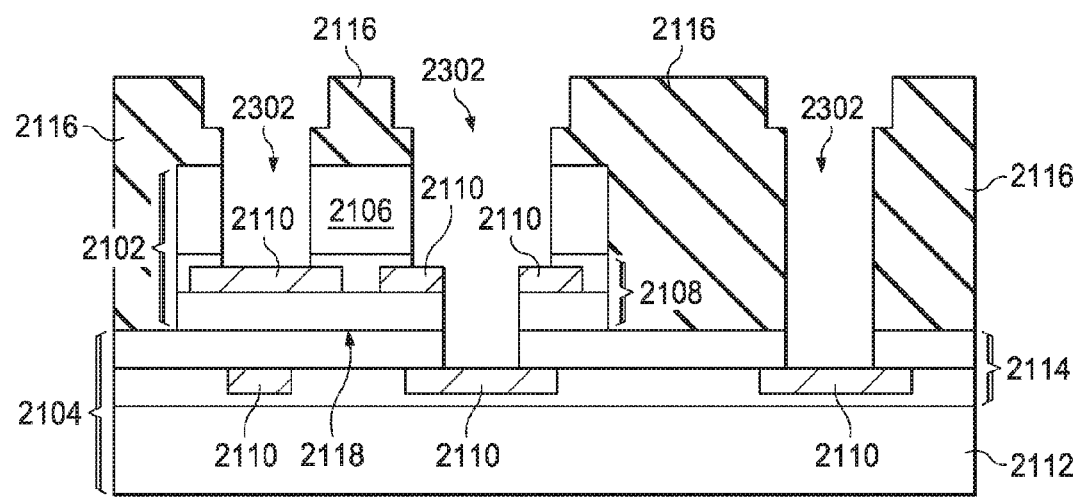

FIG. 26 illustrates a cross-sectional view of etching the RDLs 2108 and 2114 according to an embodiment. The RDLs 2108 and 2114 are etched and the second mask 2402 is removed. In some embodiments, a time mode etch process is used so that the etching process etches a predetermined depth. Etching with the second mask results in upper portions of the via openings 2302 having a width wider than the lower portions of the via openings 2302. The time mode etch controls the depth of the upper portions of the via openings 2302, and results in the lower portions of the via openings 2302 being extended downward to expose the underlying conductive elements 2110.

Figure 27:
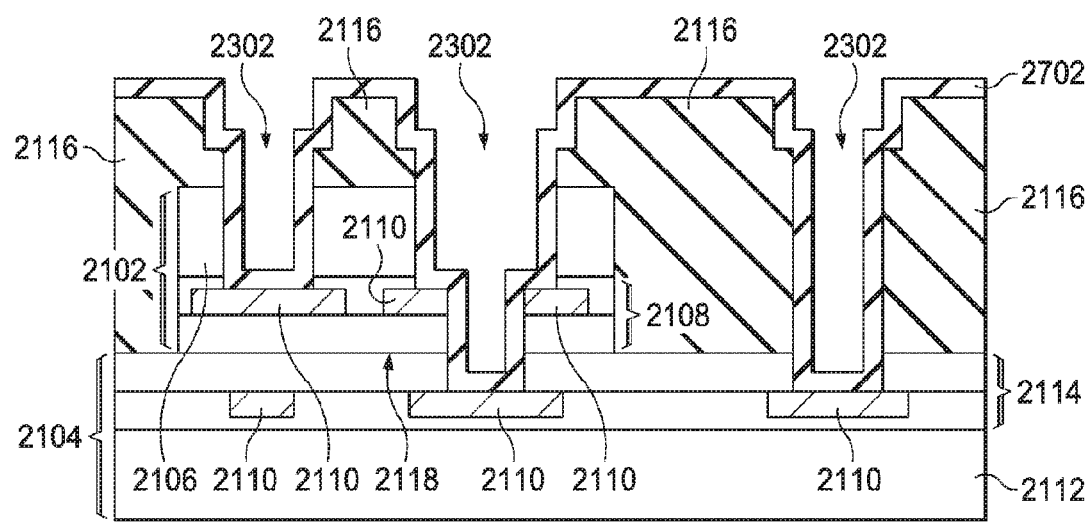

FIG. 27 is a cross-sectional view illustrating formation of an isolation layer 2702 according to an embodiment. A conformal dielectric isolation layer 2702 is formed over the insulating film 2116 and extends into the via openings 2302. In an embodiment, the isolation layer 2702 is formed as described above. The isolation layer 2702 extends into each of the via openings 2308 and covers the sidewalls of the via openings 2308, including the portions of the die substrate 2106 exposed in the via openings 2302.

Figure 28:
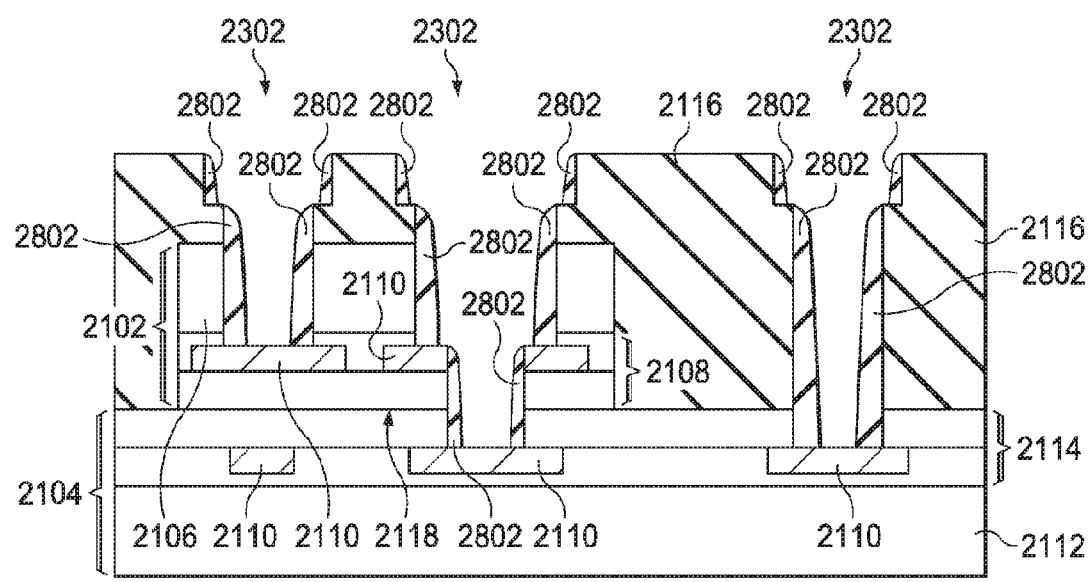

FIG. 28 is a cross-sectional view illustrating formation of self-aligning spacers 2802 according to an embodiment. In some embodiments, the isolation layer 2702 (see FIG. 27) is etched as described above, removing the lateral portions of the isolation layer 2702 and leaving the spacers 2802 on the sidewalls of the via openings 2302. The spacers 2802 insulate the die substrate 2106 from the via openings 2302 and expose portions of the top surfaces of the conductive elements 2110. In some dual damascene embodiments, separate spacers 2802 are formed in the upper and lower portions of the via openings 2302, with the upper and lower spacers 2802 laterally separated from each other and exposing a lateral surface of the insulating film 2116. Additionally, the lower spacers 2802 extend from conductive elements 2110 in the RDLs 2108 and 2114 above the die substrate 2106 into the insulating film 2116.

Figure 29:
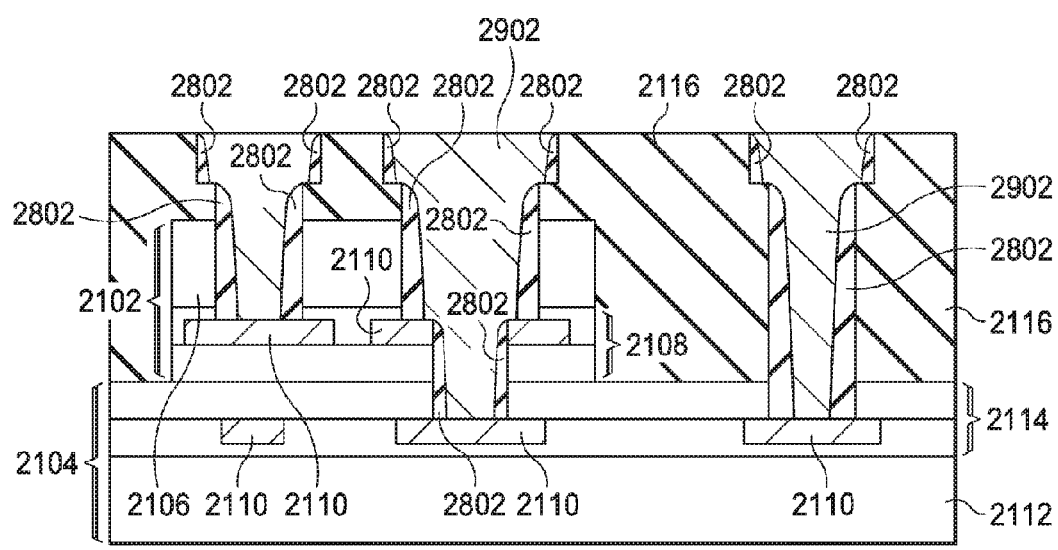
Figure 30:
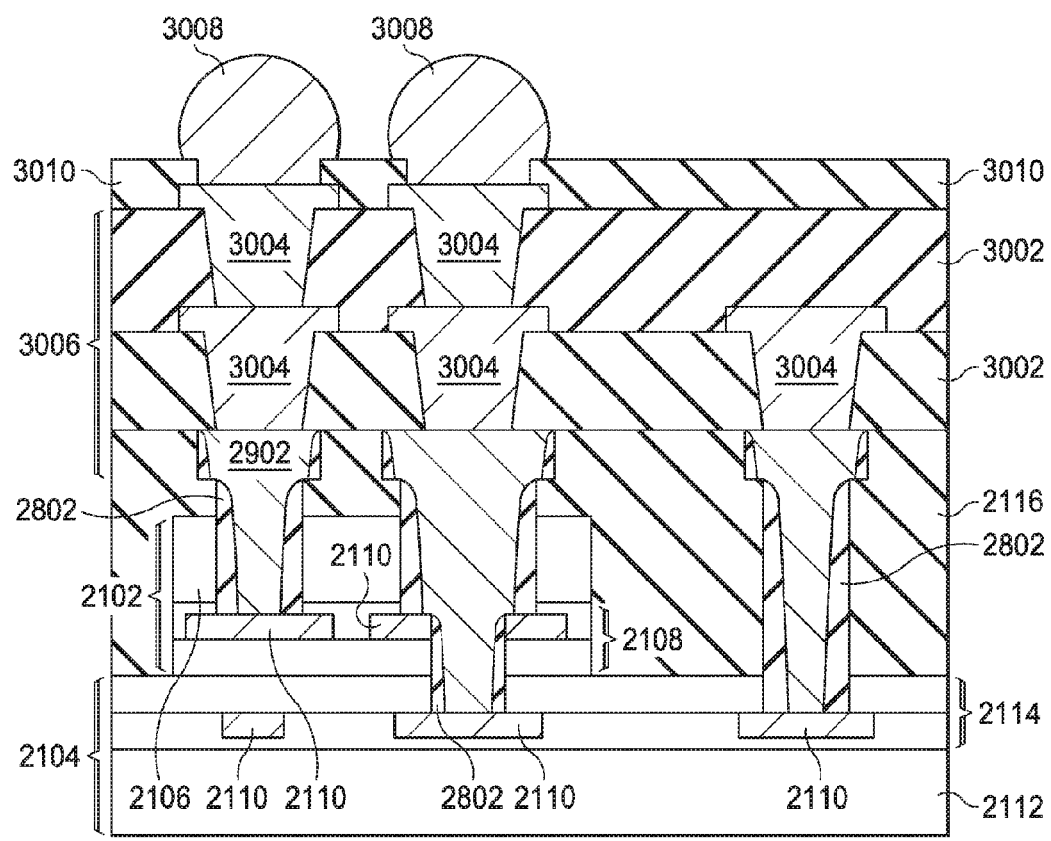

FIG. 29 is a cross-sectional view illustrating formation of vias 2902 in the via openings 702 according to an embodiment. In some embodiments, the vias 2902 are formed as described above. The vias 2902 are insulated from the die substrate 2106 by the spacers 2802 and extend from the top surface of the insulating film 2116 to the conductive elements 2110. In some embodiments, the top portions of the vias 2902 extend laterally through the top portion of the insulating film 2116, forming a first layer for a top RDL in the insulating film 2116. Forming the spacers 2802 after the second etch permits the spacers to be formed full height within the via openings 2302. In some embodiments, a barrier layer, seed layer and metal layer are formed in the via openings 2302, and then reduced by CMP or the like. Thus, discrete steps form forming the conductive elements of the first layer of the top RDL can be consolidated into the via formation process, reducing costs and increasing throughput.

FIGS. 31 through 36 illustrate cross-sectional views of intermediate processing steps in forming a chip-on-wafer structure using substrate sidewall recess process according to an embodiment. FIG. 31 illustrates a cross-sectional view of forming an insulating film 3116 and a mask 3120 over a die 3102 bonded to a wafer 3104 according to an embodiment. The die 3102 and wafer 3104 have, respectively, a die substrate 3106 and wafer substrate 3112 having one or more active devices. A die RDL 3108 and wafer RDL 3114 are disposed on the respective substrates 3106 and 3112. RDLs 3108 and 3114 each comprise dielectric layers with conductive elements 3110 disposed therein, some of which are in contact with the active devices in the respective substrates 3106 and 3112. The die 3102 and wafer 3104 are bonded as described above so that the die RDL 3108 and wafer RDL 3114 are in contact and form a bond interface 3118. The insulating film 3116 is formed over the die 3102 and wafer 3104 as described above, and in some embodiments, extends over the die 3102.

As further illustrated by FIG. 31, a mask 3120 is formed on the package according to an embodiment. In such an embodiment, mask 3120 is formed over the insulating film 3116. The mask 3120 is, in some embodiments, a photoresist that is deposited using spin-on coating processes, for example. In other embodiments, mask 3120 is hard mask or etch stop layer comprising a nitride such as silicon nitride (SiN), a carbide such as silicon carbide (SiC) or an oxynitride such as silicon oxynitride (SiON), or another etch stop material. In such an embodiment, mask 3120 is deposited using CVD, PECVD, physical vapor deposition (PVD), epitaxy, a spin-on process, or another deposition process.

FIG. 32 illustrates a cross-sectional view of patterning the mask 3120 according to an embodiment. For example, in embodiments where mask 3120 is a photoresist, it may be exposed and developed as described above to include an opening 3202. In other embodiments where mask 3120 is a hard mask or etch stop layer, a photoresist (not shown) may first be deposited, exposed, and developed over mask 3120. Subsequently, the pattern of the photoresist may be transferred to mask 3120 by etching, for example.

FIG. 32 further illustrates a cross-sectional view of etching the die substrate 3106 and die RDL 3108 according to an embodiment. Via opening 3202 is extended through the insulating film 3116, and through the die substrate 3106 and die RDL 2108 to expose a conductive element 3110. Via opening 3202 further exposes sidewalls of die substrate 3106. In an embodiment, the via opening 3202 is etched as described above. Although only one via opening 3202 is illustrated, any number of via openings may be formed.

FIG. 33 illustrates a cross-sectional view of sidewall recess process applied to die substrate 3106 according to an embodiment. Sidewalls 3302 of the die substrate 3106 exposed by via opening 3202 may be etched further using a selective etching process. The selective etch process may be chosen so that the material of die substrate 3106 is etched without significantly etching the isolation film 3116, die RDL 3108, or conductive element 3110. For example, where the die substrate 3106 is silicon, the die substrate 3106 may be dry plasma etched with a chlorine based etchant, such as gaseous chlorine (Cl2) or wet etched with potassium hydroxide (KOH) or a nitric acid/hydrofluoric acid (HNO3/HF) mix. The selective etch process recesses sidewalls 3302 of die substrate 3106 so that they are vertically misaligned with sidewalls of mask 3120, isolation film 3116, and die RDL 3108. After etching, sidewalls 3302 of die substrate 3106 is spaced apart from sidewalls of mask 3120, isolation material 3116, and die 3108 by a lateral distance D1. In some embodiments, lateral distance D1 may be about 1 μm or less.

It has been observed that recessing exposed sidewalls 3302 of die substrate 3106 may advantageously protect die substrate 3106 from damage during sidewall spacer formation processes. For example, the etch back of an isolation layer (e.g., isolation layer 3402 in FIGS. 34 and 35) during subsequent process steps to form sidewall spacers may risk damage to die substrate 3106. Top corner areas 3304 of die substrate 3106 exposed by opening 3202 may be particularly at risk to damage. By recessing sidewalls 3302 of die substrate 3106, mask 3102 may provide better coverage and protection to die substrate 3106 during sidewall spacer processing (e.g., etching as illustrated by see FIG. 35).

FIG. 34 is a cross-sectional view illustrating formation of an isolation layer 3402 according to an embodiment. A conformal dielectric isolation layer 3402 is formed extending into via opening 3202 and on exposed surfaces of mask 3120, isolation film 3116, die substrate 3106, die RDL 3108, and conductive element 3110. In an embodiment, the isolation layer 3402 is formed as described above using a conformal deposition process (e.g., CVD, PECVD, or the like). In an embodiment, at least a portion of isolation layer 3402 (e.g., a portion on sidewalls 3302) is covered by mask 3120 due to substrate sidewall recessing. It has been observed that the recessing of die substrate 3106 sidewalls reduces substrate damage during isolation layer etching. Thus, isolation layer 3402 may be advantageously formed thinner while still providing sufficient protection to die substrate 3702. For example, isolation layer 3402 may have a thickness D2 of about 10 µm or less.

Figure 35:
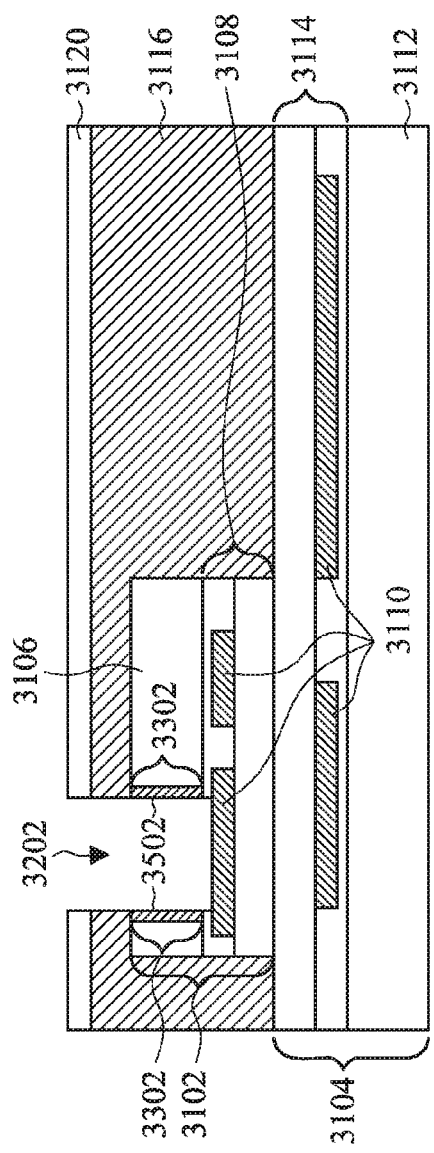

FIG. 35 is a cross-sectional view illustrating formation of sidewall spacers 3502 according to an embodiment. In some embodiments, the isolation layer 3402 (see FIG. 34) is etched, and mask 3120 is used as a patterning mask during the etching. In such embodiments, portions of isolation layer 3402 not covered by mask 3120 are removed while leaving at least a portion of isolation layer 3402 on sidewalls 3302 of die substrate 3106. In some embodiments, isolation layer 3402 is etched using a dry etch process as described above. For example, a dry plasma etch is used with chlorine, sulfur hexafluoride, carbon tetrafluoride, chlorine or another etchant in an argon (Ar), helium (He) or other environment. In some embodiments, the etchant is provided with, for example, oxygen ($O_2$), nitrogen ($N_2$) or other process gasses to increase the selectivity of the etch. In such an etch, the environment is maintained between about 25° C. and about 150° C. at a pressure between about 10 mtorr and about 200 mtorr. The etching may further be an anisotropic process.

After etching, spacers 3502 remain on sidewalls of substrate 3106. In some embodiments, top and bottom surfaces of spacers 3502 are substantially level with respective top and bottom surfaces of substrate 3106. As described above, die substrate 3106 may be masked by mask 3120 during the etching due to the recessing of sidewalls 3302 of substrate 3106. Thus, mask 3120 is used to protect sidewalls 3302 during the etching of isolation layer 3402. Furthermore, as a result of this etching, at least one sidewall of each spacer 3502 is aligned with a sidewall of insulating film 3116. Spacers 3502 insulate the die substrate 3106 from via opening 3202 and expose portions of the top surfaces of the conductive elements 3110.

Figure 36:
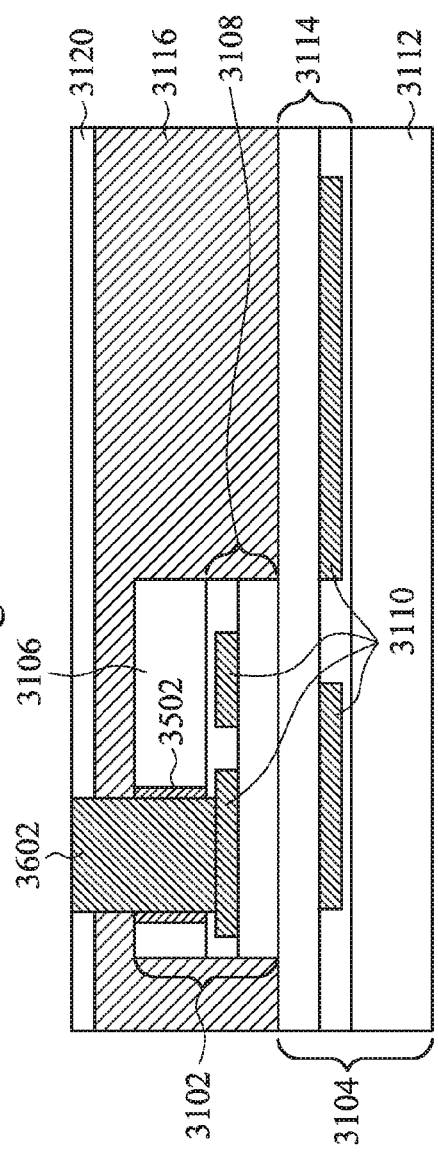

FIG. 36 is a cross-sectional view illustrating formation of via 3602 in via opening 3202 according to an embodiment. In some embodiments, via 3602 are formed as described above. Via 3602 is insulated from the die substrate 3106 by the spacers 3502 and extend from the top surface of the insulating film 3116 to the conductive elements 3110. In some embodiments, a barrier layer, seed layer and metal layer are formed in via opening 3202, and then reduced by CMP or the like. Thus, discrete steps form forming the conductive elements of the first layer of the top RDL can be consolidated into the via formation process, reducing costs and increasing throughput. Subsequently, mask 3120 may be removed and additional processing, such as the formation of top RDLs and/or connectors, may be performed over the device of FIG. 36 as described above.

FIGS. 37 through 44 illustrate cross-sectional views of intermediate processing steps in forming a chip-on-wafer structure using substrate sidewall recess process according to another embodiment. FIG. 37 illustrates a cross-sectional view of formation of an insulating film 3716 and a mask 3720 over a die 3702 bonded to a wafer 3704 according to an embodiment. The die 3702 and wafer 3704 have, respectively, a die substrate 3706 and wafer substrate 3712 having one or more active devices. A die RDL 3708 and wafer RDL 3714 are disposed on the respective substrates 3706 and 3712 and comprise dielectric layers with conductive elements 3710 disposed therein, some of which are in contact with the active devices in the respective substrates 3706 and 3712. The die 3702 and wafer 3704 are bonded as described above so that the die RDL 3708 and wafer RDL 3714 are in contact and form a bond interface 3718. The insulating film 3716 is formed over the die 3702 and wafer 3704 as described above, and in some embodiments, extends over the die 3702.

As further illustrated by FIG. 37, a mask 3720 is disposed on the package according to an embodiment. In such an embodiment, mask 3720 is formed over the insulating film 3716. The mask 3720 is, in some embodiments, a photoresist that is deposited using spin-on coating processes, for example. In other embodiments, mask 3720 is hard mask or etch stop layer as described above. In such an embodiment, mask 3720 is deposited using CVD, PECVD, physical vapor deposition (PVD), epitaxy, a spin-on process, or another deposition process.

FIG. 38 illustrates a cross-sectional view of patterning the mask 3720 according to an embodiment. For example, in embodiments where mask 3720 is a photoresist, it may be exposed and developed as described above to include an opening 3802. In other embodiments where mask 3720 is a hard mask or etch stop layer, a photoresist (not shown) may first be deposited, exposed, and developed over mask 3720. Subsequently, the pattern of the photoresist may be transferred to mask 3720 by etching, for example.

FIG. 38 further illustrates a cross-sectional view of etching of insulating film 3716 and the die substrate 3706 according to an embodiment. Opening 3802 is extended through the insulating film 3716 and through the die substrate 3706. Opening 3802 may be aligned with at least a subset of conductive elements 3710 in die RDL 3708 and/or wafer RDL 3714. In an embodiment, the via opening 3802 is etched as described above. For example, a selective etch process may be applied to die substrate 3706 so that opening 3802 stops at die RDL 3708. Although only one via opening 3802 is illustrated, any number of via openings may be formed.

Figure 39:
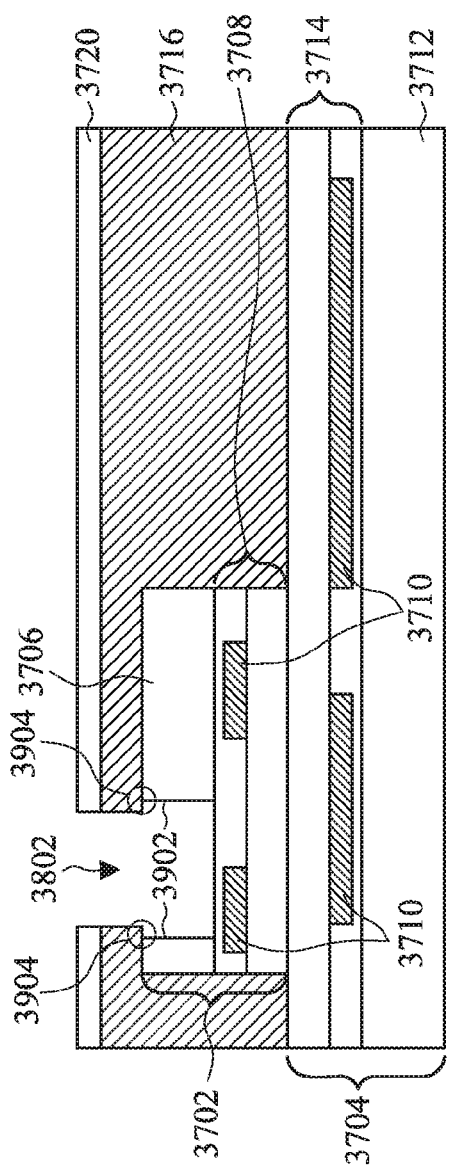

FIG. 39 illustrates a cross-sectional view of sidewall recess process applied to die substrate 3706 according to an embodiment. Sidewalls 3902 of the die substrate 3706 exposed by via opening 3802 may be etched further using a selective etching process as described above. The selective etch process may be chosen so that the material of die substrate 3706 is etched without significantly etching mask 3720, isolation film 3716, or die RDL 3708. The selective etch process recesses sidewalls 3902 of die substrate 3706 so that they are vertically misaligned with sidewalls of mask 3720 and isolation film 3716. After etching, sidewalls 3902 of die substrate 3706 is spaced apart from sidewalls of mask 3720 and isolation film 3716 by a lateral distance of about 1 µm, for example. As discussed above, it has been observed that recessing sidewalls 3302 of die substrate 3706 may advantageously allow mask 3720 to protect die substrate 3706 from damage during sidewall spacer formation processes (e.g., during the etching of an isolation layer) as well as allowing for the formation of a thinner isolation layer.

Figure 40:
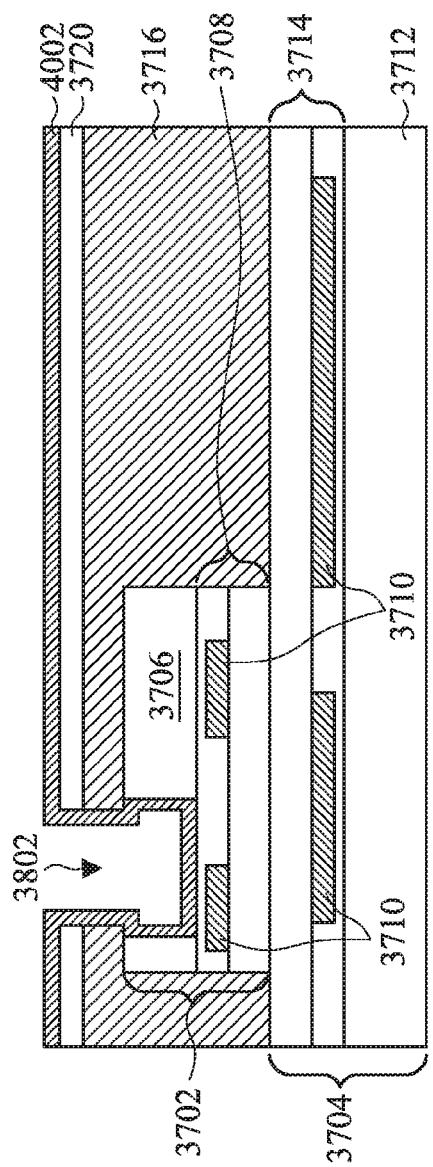

FIG. 40 is a cross-sectional view illustrating formation of a first isolation layer 4002 according to an embodiment. A conformal dielectric isolation layer 4002 is formed extending into via opening 3802 and on exposed surfaces of mask 3720, isolation film 3716, die substrate 3706, and die RDL 3708. In an embodiment, the isolation layer 4002 is formed as described above using a conformal deposition process (e.g., CVD, PECVD, or the like). It has been observed that the recessing of die substrate 3106 sidewalls reduces substrate damage during isolation layer etching. Thus, isolation layer 4002 may be advantageously formed thinner while still providing sufficient protection to substrate 3706.

Figure 41:
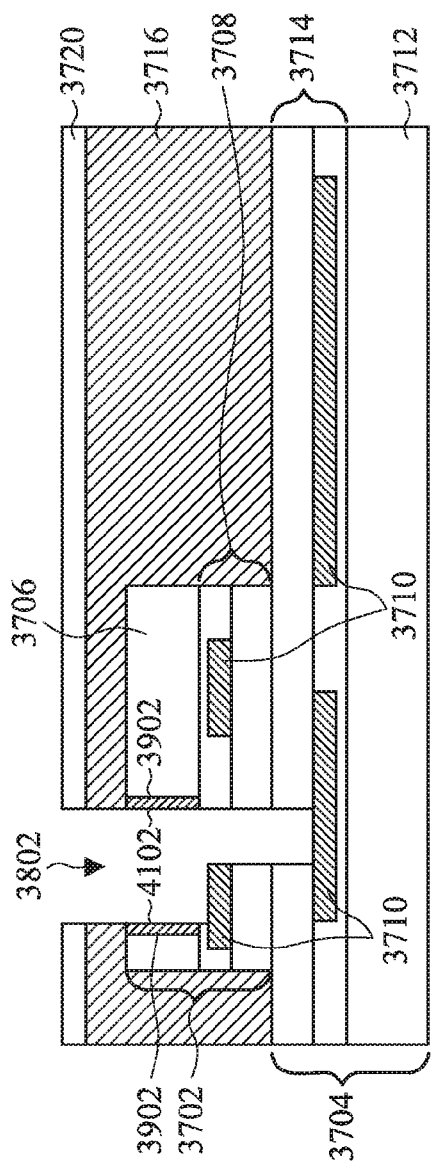

FIG. 41 is a cross-sectional view illustrating formation of spacers 4102 according to an embodiment. In some embodiments, the isolation layer 4002 (see FIG. 40) is etched using mask 3720 as a patterning mask during the etching. The etching removes portions of isolation layer 4002 not covered by mask 3720 while leaving portions of isolation layer 4002 on sidewalls 3902 of die substrate 3706. In some embodiments, isolation layer 4002 is etched using a dry etch process as described above. After etching, spacers 4102 remain on sidewalls of die substrate 3706. As described above, spacers 4102 may be masked by mask 3720 during the etching due to the recessing of die substrate 3706. Spacers 4102 insulate the die substrate 3706 from the via openings 3802.

FIG. 41 further illustrates the exposing of conductive elements 3710 in die RDL 3708 and wafer RDL 3714 according to an embodiment. In some embodiments, RDLs 3708 and 8714 are etched use conductive elements 3710 in the oxide layers of the RDLs 3708 and 3714 as an etch stop layer, permitting etching of the RDLs 3708 and 3714 to different depths. Etching the oxide layers extends via opening 3802 to conductive elements 3710 in the RDLs 3708 and 3714 as described above. Thus, a single via opening 3802 can expose surfaces of multiple conductive elements 3710. In some other embodiments, a time mode etch process is used so that the etching process etches a predetermined depth to expose the underlying conductive elements 3710 in RDLs 3708 and 3714. In some embodiments, the etching of RDLs 3708 and 3714 may occur after the formation of spacers 4102. In such embodiments, spacers 4102 protects die substrate 3706 during the etching of various RDLs.

Figure 42:
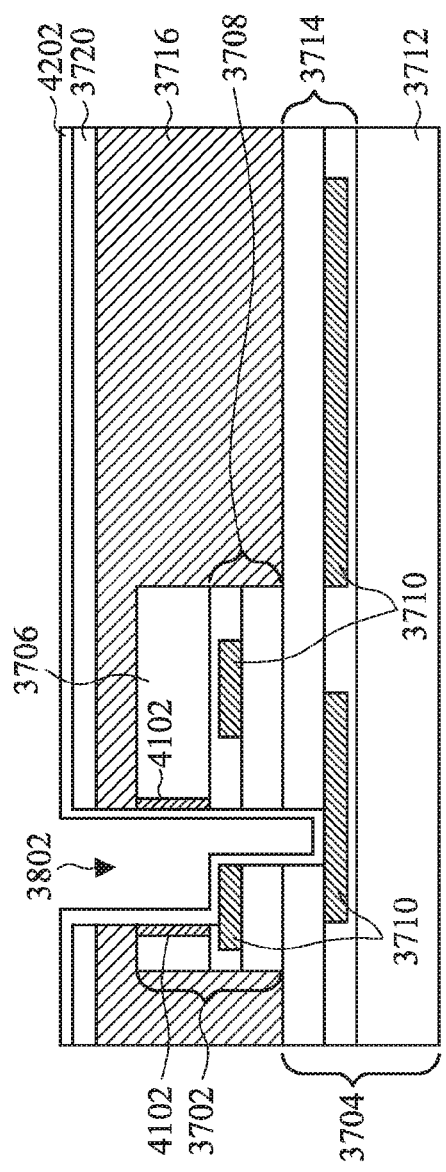

FIG. 42 is a cross-sectional view illustrating formation of a second isolation layer 4202 according to an embodiment. A conformal dielectric isolation layer 4202 is formed over mask 3720 and extends into via opening 3802. In an embodiment, the isolation layer 4202 is formed as described above. The isolation layer 4302 extends into via opening 3802 and covers the sidewalls of via opening 3808, including spacers 4102 on sidewalls of die substrate 3706.

FIG. 43 is a cross-sectional view illustrating formation of self-aligning spacers 4302 according to an embodiment. In some embodiments, the isolation layer 4202 (see FIG. 42) is etched as described above, removing the lateral portions of the isolation layer 4202 and leaving the spacers 4302 on the sidewalls of via opening 3802 (including sidewalls of spacers 3902). The spacers 4302 further insulate the die substrate 3706 and RDLs 3708 and 3714 from via opening 3802 and expose portions of the top surfaces of the conductive elements 3710. In some embodiments, separate spacers 4302 are formed in the upper and lower portions of the via opening 3802, with the upper and lower spacers 4302 laterally separated from each other and exposing a lateral surface of the conductive element 3710 in die RDL 3708.

FIG. 44 is a cross-sectional view illustrating formation of via 4402 in via opening 3802 according to an embodiment. In some embodiments, via 4402 is formed as described above. The via 4402 is insulated from the die substrate 3706 by the spacers 4302 and extends from the top surface of the insulating film 3716 to the conductive elements 3710. The vias are further insulated from the die substrate 3706 by spacers 3902 formed on recessed sidewalls of die substrate 3706. In some embodiments, a barrier layer, seed layer and metal layer are formed in the via openings 3802, and then reduced by CMP or the like. Thus, discrete steps form forming the conductive elements of the first layer of the top RDL can be consolidated into the via formation process, reducing costs and increasing throughput. Subsequently, mask 3720 may be removed and additional processing, such as the formation of top RDLs and/or connectors, as described above, may be performed over the device of FIG. 44.

Figure 45A:
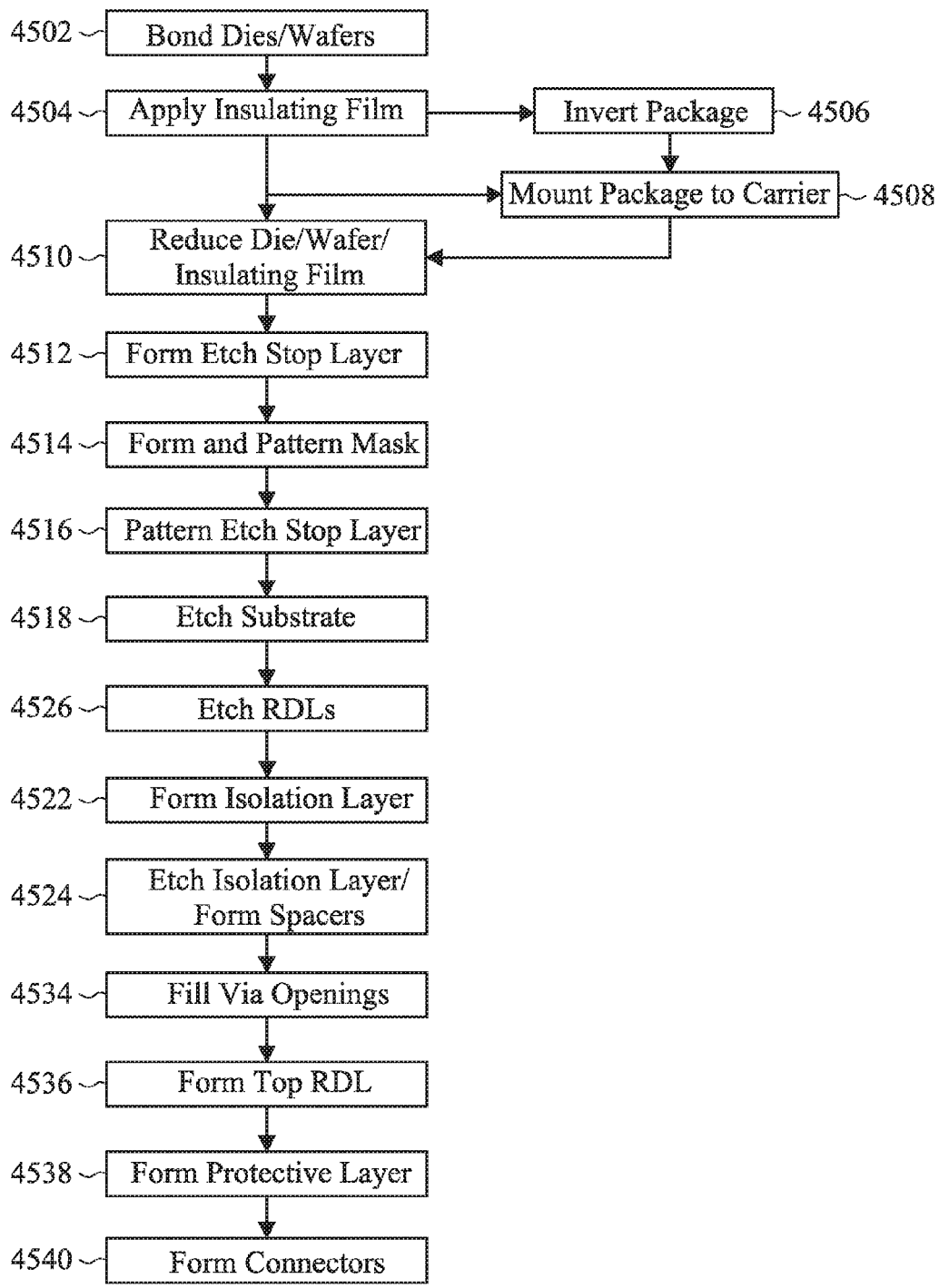
FIGS. 45A-45E are flow diagrams illustrating a method of forming chip-on-wafer structures according to some embodiments.

FIG. 45A is a flow diagram illustrating a method 4500 of forming chip-on-wafer structures according to some embodiments. Initially one or more dies are bonded to a wafer in block 4502, or two wafers are bonded together. An insulating film is formed over the bonded die and wafer in block 4504. In some embodiments, the package is inverted in block 4506 and mounted to a carrier in block 4508. The package is reduced by CMP, grinding, polishing or otherwise reducing the die, wafer or insulating film on block 4510. In some embodiments, an etch stop layer is formed in block 4512. A first mask is formed and patterned in block 4514 and the etch stop layer is patterned in block 4516. The substrate of the die or wafer is etched in block 4518 and the RDLs between the wafer and die are etched in block 4526. The isolation layer is formed in block 4522 and etched to form the spacers in block 4524. Via openings formed by the etching are filled with a conductive material in block 4534. A top RDL is formed in block 4536. In some embodiments, a protective layer is formed over the top TDL in block 4538. Connectors are formed over the top RDL in contact with conductive elements of the top RDL in block 4540.

Figure 45B:
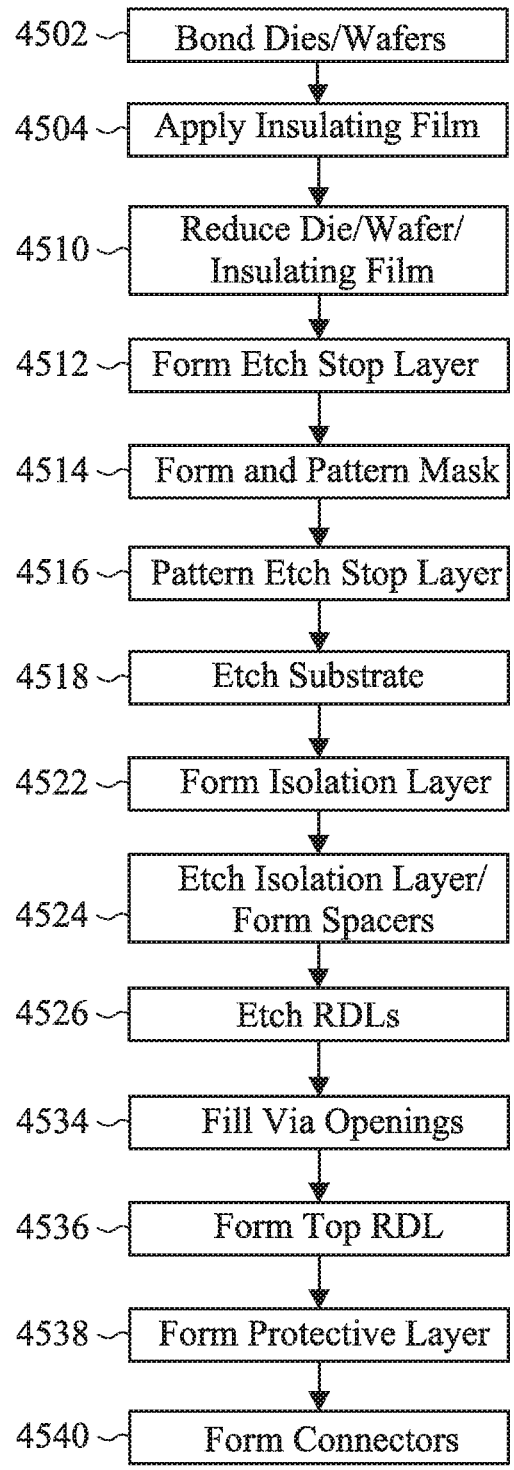

FIG. 45B is a flow diagram illustrating a method 4560 of forming chip-on-wafer structures according to other embodiments. In such embodiments, partial height spacers are formed by a process similar to that described above. In some embodiments, the step of inverting the package and mounting the package to a carrier is skipped. Additionally, the isolation layer is formed in block 4522 after etching the substrate in block 4518. The isolation layer is etched in block 4524, and the RDLs are etched in block 4526 using the spacers as masks for etching the RDLs. The via openings formed by the etching are then filled in block 4534, and the process continues as described above.

Figure 45C:
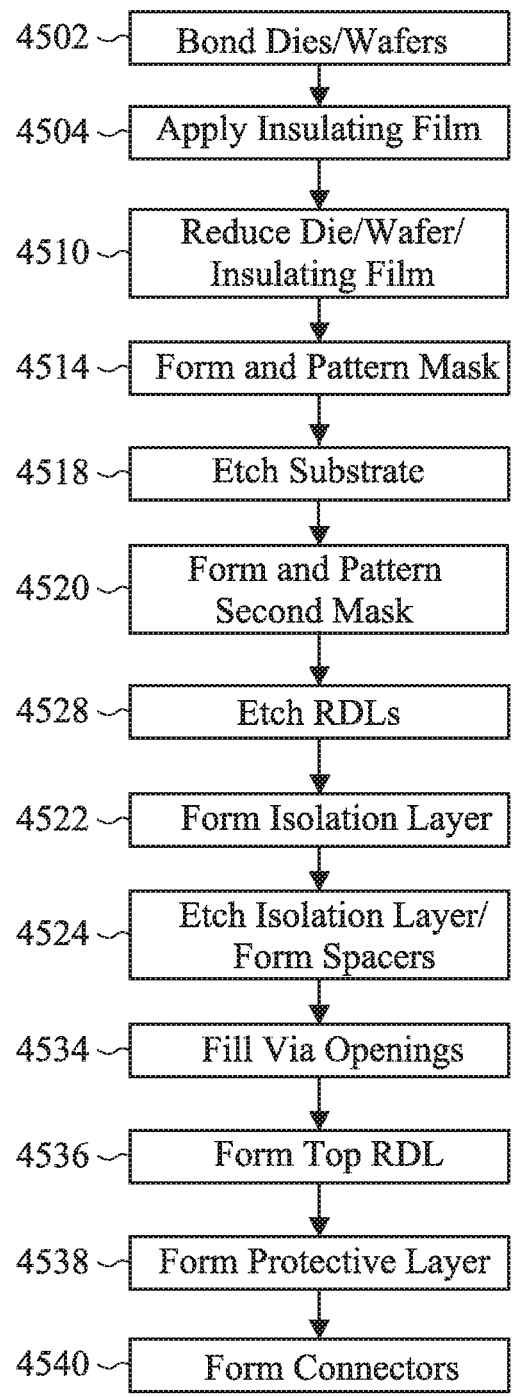

FIG. 45C is a flow diagram illustrating a method 4565 of forming chip-on-wafer structures according to other embodiments. In such embodiments, a dual damascene technique is used to form vias with upper portions that are wider than, or extend laterally from, the lower portions of the vias. In some embodiments, the substrate is etched in block 4518, and a second mask is formed and patterned in block 4520. The RDLs are etched in block 4528, with the second mask defining the upper portions of the via openings. The isolation layer is formed in block 4522, and the process continues as described above.

Figure 45D:
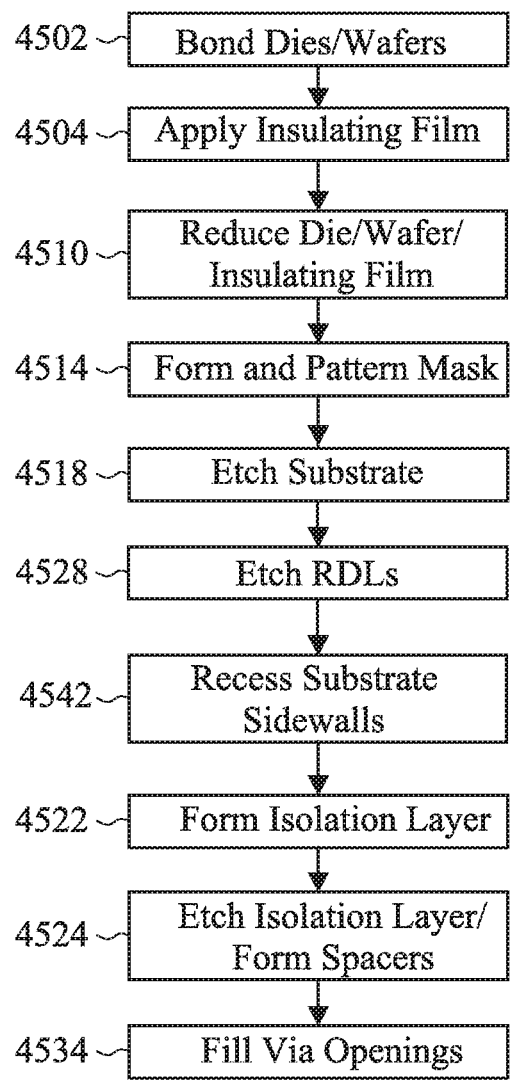

FIG. 45D is a flow diagram illustrating a method 4570 of forming chip-on-wafer structures according to other embodiments. In such embodiments, sidewalls of a substrate are recessed to protect the substrate during spacer formation processes (e.g., etching). In some embodiments, the substrate is etched in block 4518, and sidewalls of the substrate a recessed in block 4542. An isolation layer is formed on the substrate (including the recessed sidewalls) in block 4522, and the isolation layer is etched to form spacers in block 4524. The pattern mask may be used to mask the recessed sidewalls during the isolation layer etching. Thus, damage to the substrate during the isolation layer etching process. The process then continues as described above.

Figure 45E:
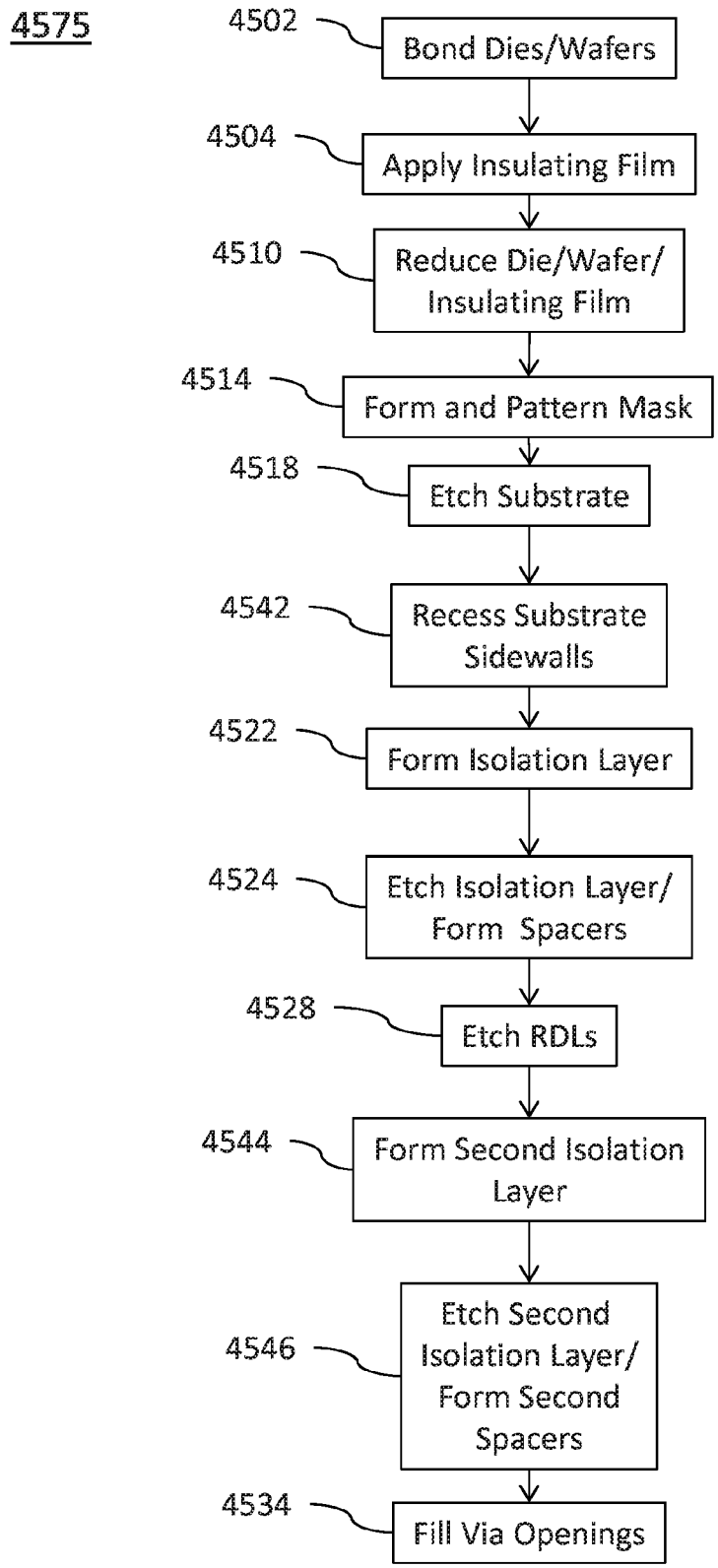

FIG. 45E is a flow diagram illustrating a method 4575 of forming chip-on-wafer structures according to other embodiments. In such embodiments, sidewalls of a substrate are recessed to protect the substrate during spacer formation processes (e.g., etching), a first spacer is formed, conductive elements are exposed, and a second spacer is formed. In some embodiments, the substrate is etched in block 4518, and sidewalls of the substrate a recessed in block 4542. An isolation layer is formed on the substrate (including the recessed sidewalls) in block 4522, and the isolation layer is etched to form first spacers in block 4524. RDLs are etched exposing conductive elements in the RDLs in block 4528. A second isolation layer is formed in block 4544 and the second isolation is etched to form second spacers in block 4546. The first spacers may be disposed between the second spacers and the substrate, and the first spacers may protect the substrate from damage during the etching of the second isolation layer. The process then continues as described above.

Thus, according to an embodiment, a package having a first redistribution layer (RDL) disposed on a first semiconductor substrate and a second RDL disposed on a second semiconductor substrate. The first RDL is bonded to the second RDL. The package further includes an insulating film disposed over the second RDL and around the first RDL and the first semiconductor substrate. A conductive element is disposed in the first RDL. A via extends from a top surface of the insulating film, through the first semiconductor substrate to the conductive element, and a spacer is disposed between the first semiconductor substrate and the via. The spacer extends through the first semiconductor substrate.

According to another embodiment, a method includes providing a first substrate having a first redistribution layer (RDL) disposed thereon, providing a second substrate having a second RDL disposed thereon, and bonding the first RDL to the second RDL. A first conductive element is disposed in the first RDL. An insulating film is formed over the second RDL, wherein the insulating film is disposed around the first RDL and the first substrate. The method further includes etching a via opening in the insulating film and extending through the first substrate, recessing sidewalls of the first substrate in the via opening, and forming a first spacer on the sidewalls of the first substrate in the via opening. A via is formed in the via opening. The via is electrically connected to the first conductive element, and the first spacer is disposed between the via and the first substrate.

According to yet another embodiment, a method includes bonding a die to a wafer and forming an insulating film over the die and the wafer. The die includes a substrate and a first redistribution layer (RDL) bonded to a second RDL in the wafer. The insulating film extends along sidewalls of the die. A mask is formed over the insulating film, and the mask is patterned to include an opening. The method further includes extending the opening into the insulating film and through the substrate, recessing a sidewall of the substrate exposed by the opening so that the mask extends laterally past the sidewall of the substrate, forming a conformal isolation layer over the mask and on sidewalls and a bottom surface of the opening, and forming a first spacer on the sidewall of the substrate by etching the conformal isolation layer. The opening is filled with a conductive material to form a via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    providing a first substrate having a first redistribution layer (RDL) disposed thereon, wherein a first conductive element is disposed in the first RDL; providing a second substrate having a second RDL disposed thereon; bonding the first RDL to the second RDL;
    forming an insulating film over the second RDL, wherein the insulating film is disposed around the first RDL and the first substrate;
    etching a via opening in the insulating film and extending through the first substrate;
    recessing sidewalls of the first substrate in the via opening;
    forming a first spacer on the sidewalls of the first substrate in the via opening; and
    forming a via in the via opening, wherein the via is electrically connected to the first conductive element, and wherein the first spacer is disposed between the via and the first substrate.

2. The method of claim 1, wherein forming the first spacer comprises:
    conformally depositing a first isolation layer over the insulating film, wherein the first isolation layer covers sidewalls of the first via opening; and
    etching the first isolation layer.

3. The method of claim 2, further comprising forming a patterned mask layer over the insulating film, wherein etching the via opening and etching the first isolation layer comprises using the patterned mask layer as an etching mask.

4. The method of claim 1, wherein after recessing the sidewalls of the first substrate, the sidewalls of the first substrate in the via opening are misaligned with sidewalls of the insulating film in the via opening.

5. The method of claim 1, wherein etching the via opening exposes the first conductive element.

6. The method of claim 1, wherein the second RDL comprises a second conductive element, and wherein the method further comprises:
    after forming the first spacer, etching the first RDL and the second RDL to extend the via opening into the first RDL and the second RDL, wherein the via opening exposes the first conductive element and the second conductive element; and
    forming a second spacer on a sidewall of the via opening, wherein the first spacer is disposed between the second spacer and the first substrate.

7. The method of claim 6, wherein etching the first RDL and the second RDL comprises using the first conductive element acts as an etch stop layer.

8. A method comprising:
    bonding a die to a wafer, wherein the die comprises:
        a substrate; and
        a first redistribution layer (RDL) bonded to a second RDL in the wafer;

forming an insulating film over the die and the wafer, wherein the insulating film extends along sidewalls of the die;

forming a mask over the insulating film, wherein the mask is patterned to include an opening;

extending the opening into the insulating film and through the substrate;

recessing a sidewall of the substrate exposed by the opening so that the mask extends laterally past the sidewall of the substrate;

forming a conformal isolation layer over the mask and on sidewalls and a bottom surface of the opening;

forming a first spacer on the sidewall of the substrate by etching the conformal isolation layer; and filling the opening with a conductive material to form a via.

9. The method of claim 8, wherein recessing the sidewall of the substrate comprises a selective etching process performed on a semiconductor material of the substrate.

10. The method of claim 8, wherein the first RDL comprises a first conductive element, wherein extending the opening into the insulating film and through the substrate comprises etching the first RDL to expose the first conductive element.

11. The method of claim 8, further comprising after forming the first spacer, extending the opening through the first RDL into the second RDL, wherein the opening exposes a first conductive element in the first RDL and a second element in the second RDL.

12. The method of claim 11, further comprising after extending the opening through the first RDL into the second RDL, forming a second spacer on sidewalls of the opening, wherein the first spacer is disposed between the second spacer and the substrate.

13. A method comprising:
   directly bonding a first redistribution layer (RDL) on a first substrate to a second RDL on a second substrate;
   depositing an isolation film over the second substrate and extending along sidewalls of the second substrate and the second RDL;
   etching a via opening through isolation film and the second substrate to expose the second RDL;
   expanding the via opening by etching exposed sidewalls of the second substrate in the via opening, wherein after expanding the via opening, the via opening is wider in the second substrate than in the isolation film;
   forming first spacers on the exposed sidewalls of the second substrate;
   forming second spacers in the via opening on the first spacers, wherein the first spacers are disposed between the second spacers and the second substrate; and
   filling remaining portions of the via opening with a conductive material.

14. The method of claim 13 further comprising, after forming the first spacers, further expanding the via opening by etching the first RDL and the second RDL to expose a first conductive feature in the first RDL and a second conductive feature in the second RDL.

15. The method of claim 14, wherein the second conductive feature in the second RDL acts as an etch stop layer during further expanding the via opening.

16. The method of claim 14, wherein forming the second spacers in the via opening comprises forming the second spacers after further expanding the via opening.

17. The method of claim 13, a sidewall of the first spacers is substantially aligned with a sidewall of the isolation film.

18. The method of claim 13, wherein forming the first spacers comprises:
   depositing a first spacer layer on sidewalls and a bottom surface of the via opening, wherein a portion of the first spacer layer is disposed under the isolation film; and
   etching the first spacer layer to form the first spacers.

19. The method of claim 18 further comprising forming an etch stop layer over the isolation film, wherein the via opening extends through the etch stop layer, and wherein the etch stop layer acts as mask during etching the first spacer layer to form the first spacers.

20. The method of claim 13, wherein forming the second spacers comprises:
   depositing a second spacer layer on sidewalls and a bottom surface of the via opening; and
   etching the second spacer layer to form the second spacers.

* * * * *